US008305294B2

(12) United States Patent
Cok et al.

(10) Patent No.: US 8,305,294 B2
(45) Date of Patent: Nov. 6, 2012

(54) TILED DISPLAY WITH OVERLAPPING FLEXIBLE SUBSTRATES

(75) Inventors: Ronald S. Cok, Rochester, NY (US); John W. Hamer, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 647 days.

(21) Appl. No.: 12/555,135

(22) Filed: Sep. 8, 2009

(65) Prior Publication Data

US 2011/0057861 A1   Mar. 10, 2011

(51) Int. Cl.
G09G 5/00 (2006.01)
(52) U.S. Cl. ............. 345/1.3; 345/40; 345/55; 345/103
(58) Field of Classification Search ........................ None
See application file for complete search history.

(56) References Cited

U.S. PATENT DOCUMENTS

| 4,769,292 | A |   | 9/1988  | Tang et al. |
| 5,061,569 | A |   | 10/1991 | VanSlyke et al. |
| 5,932,327 | A |   | 8/1999  | Inoguchi et al. |
| 6,614,171 | B2 |  | 9/2003  | Rajeswaran et al. |
| 6,728,023 | B1 | * | 4/2004 | Alioshin et al. ............. 359/290 |
| 6,881,946 | B2 |  | 4/2005  | Cok |
| 7,362,046 | B2 |  | 4/2008  | Aston |
| 2003/0234343 | A1 | | 12/2003 | Cok et al. |
| 2004/0256977 | A1 | * | 12/2004 | Aston ........................... 313/498 |
| 2006/0108915 | A1 | | 5/2006  | Cok et al. |
| 2007/0001927 | A1 | | 1/2007  | Ricks et al. |
| 2007/0057263 | A1 | | 3/2007  | Kahen |
| 2009/0021162 | A1 | | 1/2009  | Cope et al. |

FOREIGN PATENT DOCUMENTS

| EP | 1143772 A1 | 10/2001 |
| EP | 1612658 A2 | 1/2006 |
| JP | 59-147176 | 10/1984 |
| JP | 2004251981 A | 9/2004 |
| JP | 2005017738 A | 1/2005 |
| JP | 2009139463 A | 6/2009 |
| WO | 2006/023901 | 3/2006 |
| WO | 03/042966 | 5/2009 |

OTHER PUBLICATIONS

U.S. Appl. No. 12/372,906, filed Feb. 18, 2009, Cok.

* cited by examiner

*Primary Examiner* — Muhammad N Edun
(74) *Attorney, Agent, or Firm* — Morgan, Lewis & Bockius LLP

(57) ABSTRACT

A tiled display apparatus includes at least five functionally identical transparent partially-overlapped display tiles arranged in two dimensions, each display tile including pixels arranged in a two-dimensional array, and the display tiles being disposed so that light emitted by pixels located beneath a neighboring display tile at the edge of the pixel array passes through the neighboring display tile.

18 Claims, 16 Drawing Sheets

TILED DISPLAY WITH OVERLAPPING FLEXIBLE SUBSTRATES

FIELD OF THE INVENTION

The present invention relates to flat-panel display apparatus having a plurality of display tiles that each includes a flexible substrate.

BACKGROUND OF THE INVENTION

Flat-panel display devices are widely used in conjunction with computing devices, in portable electronic devices, and for entertainment devices such as televisions. Such flat-panel displays typically employ a plurality of pixels distributed over a substrate to display images. Each pixel incorporates several, differently colored light-emitting elements commonly referred to as sub-pixels, typically emitting red, green, and blue light, to represent each image element. Pixels and sub-pixels are not distinguished herein; all light-emitting elements are called pixels. A variety of flat-panel display technologies are known, for example plasma displays, liquid crystal displays, and light-emitting diode displays.

Light-emitting diodes (LEDs) incorporating thin films of light-emitting materials forming light-emitting elements have many advantages in a flat-panel display device and are useful in optical systems. One exemplary organic LED display device includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, charge transport, or charge blocking to the light-emitting-thin-film materials, and are known in the art. The thin-film materials are placed upon a-substrate between electrodes, with an encapsulating cover layer or plate. Light is emitted from a pixel when current supplied by the electrodes passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display. It is also known to employ a white light-emitting element that does not include a color filter. A design employing an unpatterned white-light emitter has been described together with a four-color pixel comprising red, green, and blue color filters and sub-pixels and an unfiltered white sub-pixel to improve the efficiency of the device.

Typical display apparatuses range in size from small displays used in mobile devices to very large displays visible to thousands of viewers. Large displays can be provided by tiling smaller display devices together. For example, video walls using multiple video displays are frequently seen in the electronic media and flat-panel displays can be tiled to create larger displays. Multiple projector systems used to create a large, tiled, high-resolution display are also known.

Flat-panel tiled displays are well known in the prior art. Many flat-panel tiled display apparatuses employ rectangular display tiles with pixel arrays formed in display areas on the display tile. Each display tile has a separate substrate that is butted together at the edges with a separate display tile to form a single, flat surface. In such a configuration, it is important that the edge seams between the display tiles be imperceptible to a viewer and therefore do not have a reflectance or light emission that differs from the display area of the display tiles. Moreover, the gap between adjacent light-emitting pixels is the same over the butted tiled edges as it is between light-emitting pixels in the display area so that the pixels are uniformly distributed over the tiled array.

Various butted tiling methods employ tile structures fastened together into an array with the use of a frame or an electroluminescent display panel including multiple small-size panels secured to a larger support with an intervening adhesive layer. Alternatively, tiled display structures can include a plurality of display tiles mounted upon a back panel that are interconnected through electrical stand-off connectors or that include a plurality of display tiles mounted upon a back panel with electrode segments formed over electrode busses. Tiles attached to a mounting surface can emit light from one surface of the tile and conductors can be connected at a second surface. It is also known to use black-matrix material in a tiled display. A tiled display can locate all of the electronic circuitry beneath the pixel array. Vertical interconnects are made between the pixel electrodes and drive circuits, thereby enabling a seamless image. Optical structure that hide tile seams are also known in the art, for example by employing a distributed ultra-low magnification fly's-eye optical system integrated with the display tiles, effectively excluding and obscuring an image of the tile seams.

Generally, prior art methods for obscuring tile seams seek to reduce the tile perimeter width so that butted-together tiles have a common inter-pixel distance over the multiple tiles. In other approaches, the tile seam is made less visible, for example through optical structures, by controlling the pixels in the display tiles, or employing special tile cutting or encapsulation techniques. Other disclosures seek to ensure that the power distribution over the tiles is uniform.

It is difficult and expensive, however, to maintain a constant inter-pixel distance across the edge of two butted-together tiles. In particular, OLED devices require protection from environmental contamination, especially moisture. To avoid such contamination, OLED devices generally employ a hermetic seal around the perimeter of the display. This hermetic seal can cause the edge of a tile to be wider than the inter-pixel distance.

Another technique for reducing tile seam visibility relies on overlapping the display tiles. For example, U.S. Patent Publication 2006/0108915, now abandoned, discloses a tiled OLED display structure wherein OLED display tiles are stacked over non-display areas of other OLED display-tile substrates. Commonly-assigned U.S. Pat. No. 6,614,171 discloses a tiled display having tiles with spaced-apart edge pixels stacked upon a back-plate that includes pixels disposed between the spaced-apart display tile edge pixels. These structures employ multiple substrates, are not readily scalable, and are difficult to interconnect. Alternatively, WO2006023901 discloses an array of display tiles for which the edge seam width is reduced by overlapping the edge of the tiles so that a ribbon cable connector can extend beneath the overlap. Another approach is described in WO 2003/042966 and U.S. Pat. No. 7,362,046. This method uses a complex support structure and a plurality of printed circuit boards, on each of which is mounted a separate display with a separate substrate. The printed circuit boards are mounted at an angle to a viewing surface and the edge of each printed circuit board overlaps the edge of a neighboring printed circuit board. In a related disclosure, commonly assigned, co-pending U.S. Patent Publication 2007/0001927 describes an electronic signage system having a plurality of display elements wherein one display element overlaps another display element. These designs can overlap the tile edge of one tile with a neighboring tile, thereby reducing the tile seam width by one half. However, this reduction can be inadequate, especially for high-resolution displays with small inter-pixel distances, and still restricts the edge width of the display tiles. U.S. Patent Application 2009/0021162 describes a flexible emissive display that can include display tiles coupled to a flexible support but does not thereby reduce tile seam visibility.

There is a need, therefore, for an improved tiled display apparatus that overcomes the problems noted above.

SUMMARY OF THE INVENTION

In accordance with the present invention, there is provided a tiled display apparatus comprising: at least five functionally identical transparent partially-overlapped display tiles arranged in two dimensions, each display tile including pixels arranged in a two-dimensional array, and the display tiles being disposed so that light emitted by pixels at the edge of the pixel array passes through a neighboring display tile.

In accordance with another aspect of the present invention there is provided a tiled electro-luminescent display apparatus, comprising:

(a) a plurality of display tiles arranged in a regular two-dimensional array, each display tile including:
  i) a transparent flexible substrate and a transparent flexible cover affixed to the transparent flexible substrate;
  ii) a first electrode formed over the transparent flexible substrate, one or more layers of light-emitting material formed over the first electrode, and a second electrode formed over the one or more layers of light-emitting material;
  iii) wherein the first or second electrode forms independently-controllable light-emitting pixels arranged in rows and columns of a regular, two-dimensional, four-sided pixel array defining a display area, the pixel array having first edge pixels located on the edge of a first side of the pixel array, second edge pixels located on the edge of a second side of the pixel array opposite the first side, third edge pixels located on the edge of a third side of the pixel array adjacent to the first and second sides, and fourth edge pixels located on the edge of a fourth side of the pixel array opposite the third side and adjacent to the first and second sides, each pixel separated from a neighboring pixel by a respective inter-pixel distance in each of the two dimensions;
  iv) wherein the transparent flexible substrate or transparent flexible cover extends beyond the pixel array on all four sides of the pixel array a distance greater than the inter-pixel distance in the respective dimensions, the transparent flexible substrate or transparent flexible cover extensions defining a first transparent tile area on the first side of the pixel array, a second tile area on the second side of the pixel array opposite the first side, a third transparent tile area on the third side of the pixel array adjacent to the first and second sides, a fourth tile area on the fourth side of the pixel array opposite the third side and adjacent to the first and second sides; and
  v) wherein the first, second, third and fourth tile areas do not include pixels; and
(b) wherein the display tiles are arranged so that:
  i) the first transparent tile area of each display tile is disposed above the second tile area of a first neighboring display tile so that light emitted from the second edge pixels of the first neighboring display tile is transmitted through the first transparent tile area;
  ii) the second tile area of each display tile is disposed below the first tile area of a second neighboring display tile so that light emitted from the second edge pixels is transmitted through the first transparent tile area of the second neighboring tile;
  iii) the third transparent tile area of each display tile is disposed above the fourth tile area of a third neighboring display tile so that light emitted from the fourth edge pixels of the third neighboring display tile is transmitted through the third transparent tile area; and
  iv) the fourth tile area of each display tile is disposed below the third transparent tile area of a fourth neighboring display tile so that light emitted from the fourth edge pixels is transmitted through the third transparent tile area of the fourth neighboring tile; and
  v) wherein the pixels in the pixel arrays of each display tile and the neighboring display tiles do not overlap, form a regular, two-dimensional pixel array, and are separated by the respective inter-pixel distances in each of the dimensions.

The present invention has the advantage that a tiled display can be arbitrarily scaled, incorporate large edge widths to suppress the ingress of moisture or other environmental contaminants, reduce tile seams, reduce manufacturing difficulties, provide a flexible display apparatus, increase light output, and provide substrate space for wiring and control circuits on the display tile substrates, thereby improving system integration.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

The layers of the figures are not to scale, since the differences in size of the elements in the figures are too great to permit depiction at scale.

DETAILED DESCRIPTION OF THE INVENTION

Figure 1:
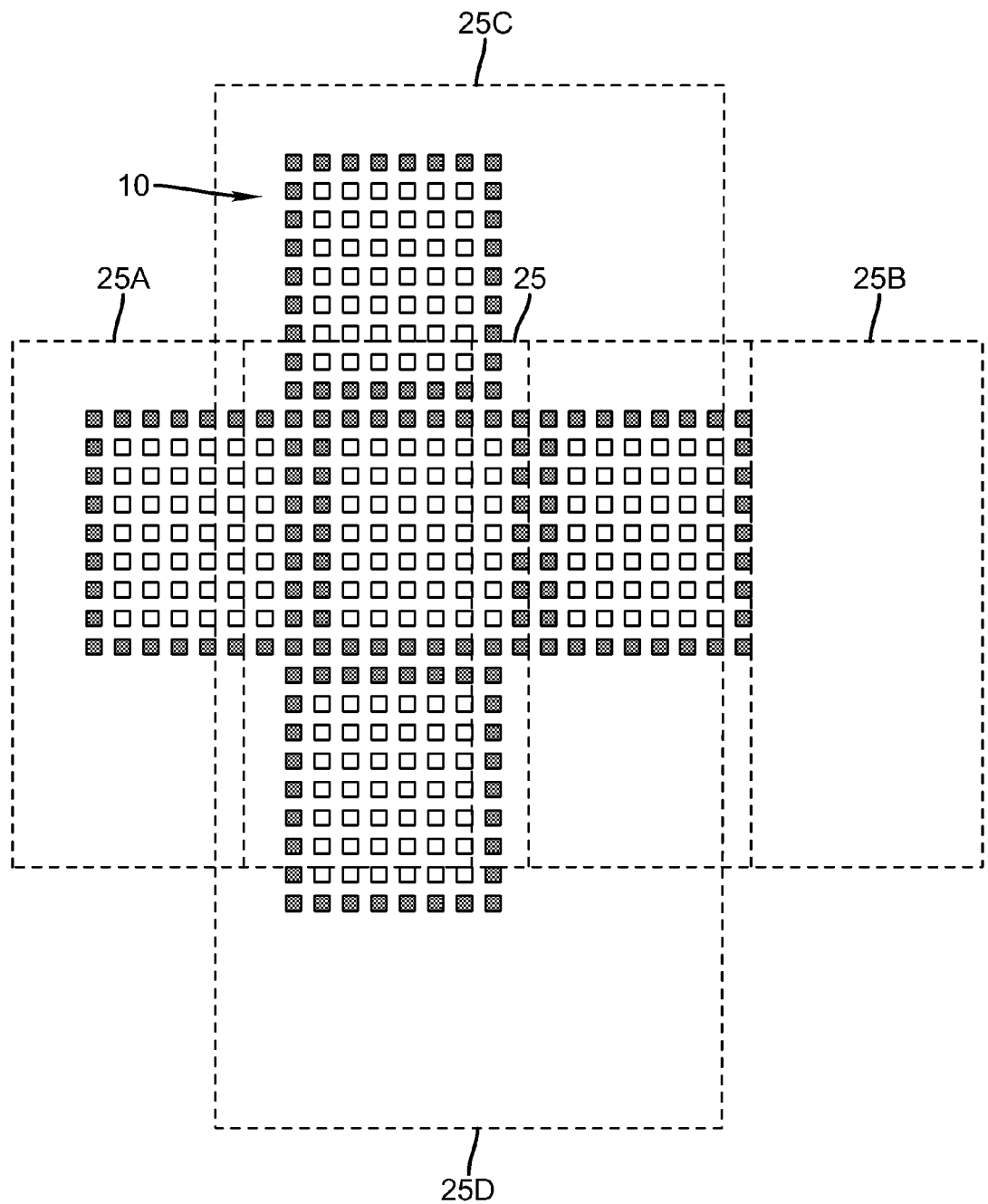
FIG. 1 is a simplified schematic of five display tiles according to an embodiment of the present invention.

In an embodiment of the present invention illustrated in FIG. 1, a tiled display apparatus can include at least five functionally identical transparent partially-overlapped display tiles 25, 25A, 25B, 25C, 25D, arranged in two dimensions, each display tile 25, 25A, 25B, 25C, 25D, including pixels arranged in a two-dimensional array 10, and the display tiles 25, 25A, 25B, 25C, 25D being disposed so that light emitted by pixels located beneath a neighboring display tile at the edge of the pixel array passes through the neighboring display tile. By partially overlapped, is meant that one or more portions, but not all, of each display tile is disposed above or below a neighboring display tile. By functionally identical is meant that the disposition of any the display tiles can be interchanged with the disposition of any of the other display tiles without operationally affecting the tiled display apparatus. For example, display tile 25A can be interchanged with any one of the display tiles 25, 25B, 25C, or 25D.

Figure 2:
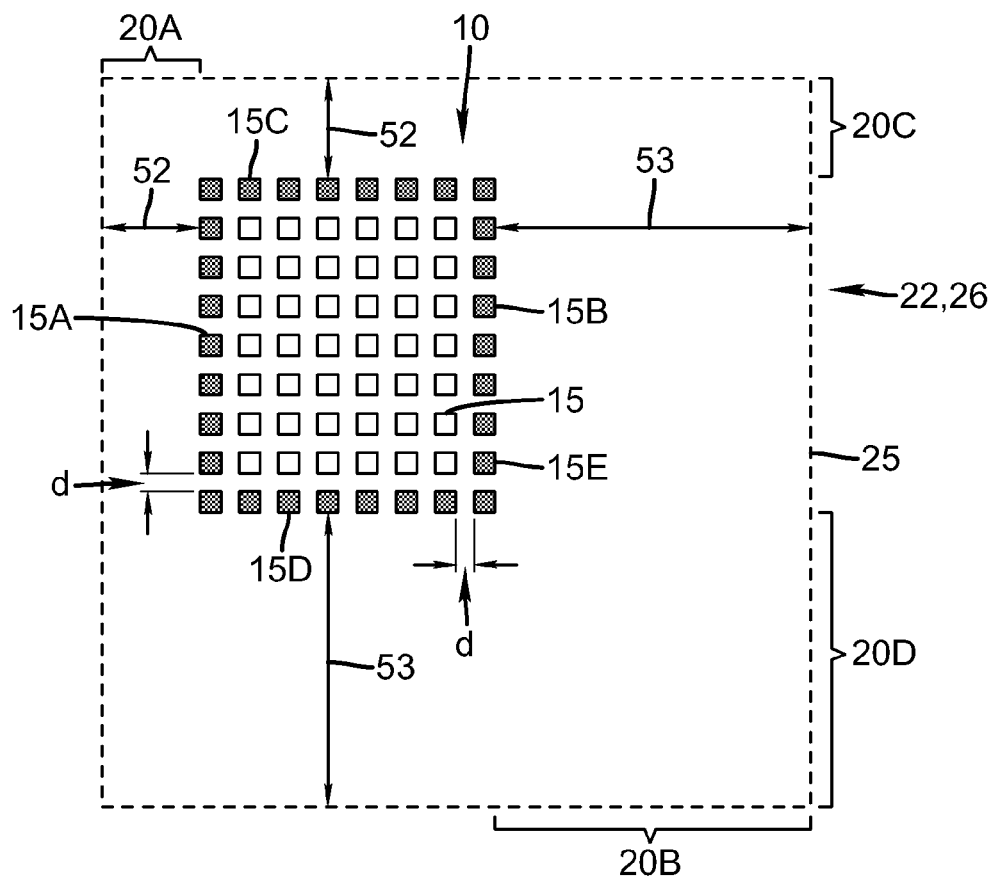
FIG. 2 is a simplified schematic of a display tile according to an embodiment of the present invention.
Figure 3:
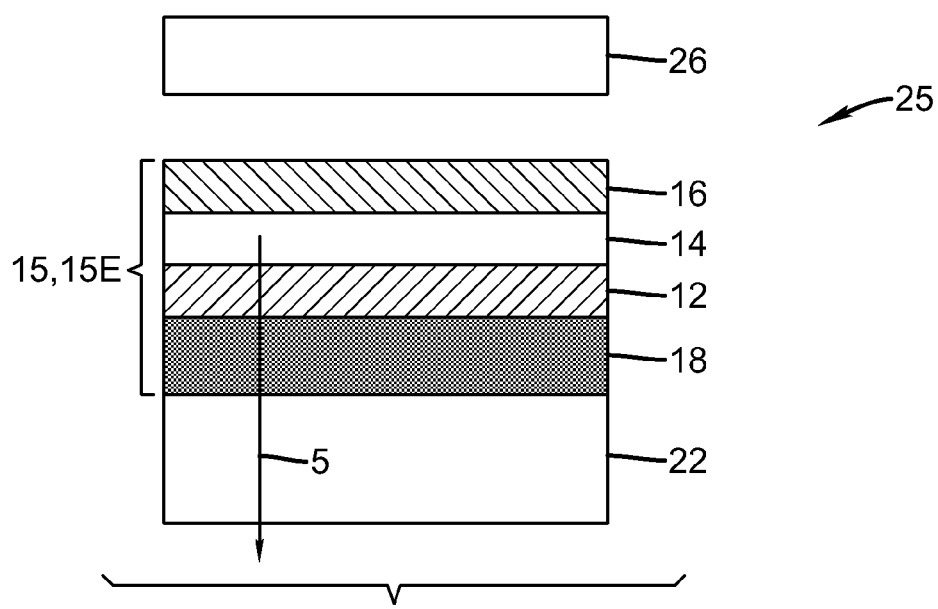
FIG. 3 is a partial cross section of an organic light-emitting diode with a color filter useful in understanding the present invention.

Referring further to FIG. 1, according to an embodiment of the present invention, a tiled electro-luminescent display apparatus includes a plurality of display tiles 25, 25A, 25B, 25C, 25D arranged in a regular two-dimensional array. Referring to FIG. 2, each display tile 25 includes a pixel array 10 comprising an array of pixels 15, some of which, e.g. pixels 15A, 15B, 15C, and 15D are located on the edge of the pixel array 10. The pixels 15A, 15B, 15C, 15D formed on the edge of the pixel array 10 are collectively referred to as edge pixels 15E. The pixels 15 are formed on a transparent flexible substrate 22 with a transparent flexible cover 26 affixed to the transparent flexible substrate 22. As shown in FIG. 3, a first electrode 12 is formed over the transparent flexible substrate 22, one or more layers 14 of light-emitting material are formed over the first electrode 12, a second electrode 16 is formed over the one or more layers 14 of light-emitting material, and an optional color filter 18 filters emitted light to form a light-emitting pixel 15, 15E. In one embodiment, illustrated in FIG. 3, the first electrode 12 is transparent and the second electrode 16 is reflective so that emitted light 5 passes through the first electrode 12 and substrate 22. Alternatively, the first electrode 12 is reflective, the second electrode 16 is transparent, and light is emitted through the cover 26.

The first or second electrode 12, 16 (FIG. 3) forms independently-controllable light-emitting pixels 15, 15E. As shown in FIG. 2, the pixels 15, 15E are arranged in rows and columns of a regular, two-dimensional, four-sided pixel array 10 defining a display area, the pixel array 10 having first edge pixels 15A located on the edge of a first side of the pixel array 10, second edge pixels 15B located on the edge of a second side of the pixel array 10 opposite the first side, third edge pixels 15C located on the edge of a third side of the pixel array 10 adjacent to the first and second sides, and fourth edge pixels 15D located on the edge of a fourth side of the pixel array 10 opposite the third side and adjacent to the first and second sides, each pixel 15, 15E separated from a neighboring pixel by an inter-pixel distance d in each of the two dimensions. The distance d can be the same in each dimension or can be different.

The transparent flexible substrate 22 or transparent flexible cover 26 extends beyond the pixel array 10 on all four sides of the pixel array 10 a distance 52, 53 greater than the inter-pixel distance d in the respective dimensions, the transparent flexible substrate 22 or transparent flexible cover 26 extensions defining a first transparent tile area 20A on the first side of the pixel array 10, a second tile area 20B on the second side of the pixel array 10 opposite the first side, a third transparent tile area 20C on the third side of the pixel array 10 adjacent to the first and second sides, a fourth tile area 20D on the fourth side of the pixel array 10 opposite the third side and adjacent to the first and second sides The first, second, third and fourth tile areas 20A, 20B, 20C, 20D do not include pixels 15, 15E and can have the same, or different, sizes. In particular, the first and third transparent tile areas 20A, 20C can extend the same distance from the pixel array 10. Typically, the second and fourth tile areas 20B, 20D extend farther from the pixel array 10 than the first and third transparent tile areas 20A, 20C as is discussed further below.

Figure 19:
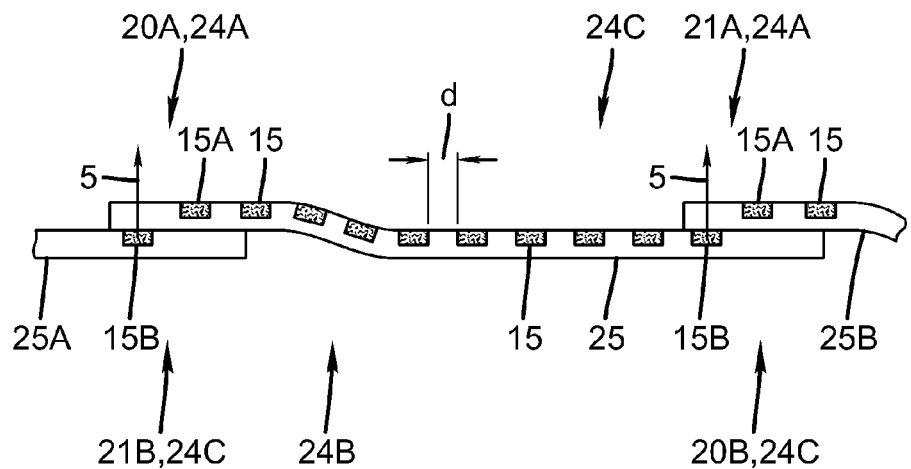
FIG. 19 is a partial cross section of three overlapping display tiles in a tiled display according to one embodiment of the present invention.

Referring back to FIGS. 1 and 2 and to FIG. 19 (in cross-section), the first transparent tile area 20A of display tile 25 is disposed above the second tile area 21B of the first neighboring display tile 25A so that light 5 emitted from the second edge pixels 15B of the first neighboring display tile 25A is transmitted through the first transparent tile area 20A. The second tile area 20B is disposed below the first tile area 21A of the second neighboring display tile 25B so that light 5 emitted from the second edge pixels 158 is transmitted through the first transparent tile area 21A of the second neighboring tile 25B. Similarly, in a second, orthogonal dimension, the third transparent tile edge 20C is disposed above the fourth tile area 20D of the third neighboring display tile 25C so that light emitted from the fourth edge pixels 15D of the third neighboring display tile 25C is transmitted through the third transparent the area 20C. The fourth tile area 20D is disposed below the third transparent tile area 20C of the fourth neighboring display tile 25D so that light emitted from the fourth edge pixels 15D is transmitted through the third transparent tile area of the fourth neighboring display tile 25D. Pixels 15 not on the edge emit light through the cover or substrate of their respective display tiles only. Note that edge pixels are those pixels that emit light through a neighboring display tile and can include pixels in the interior of the pixel array, when adjacent to other edge pixels. The pixels 15, 15A, 15B, 15E in the pixel arrays 10 of the display tile 25 and the neighboring display tiles 25A, 25B, 25C, 25D do not overlap, form a regular, two-dimensional pixel array, and are separated by the inter-pixel distance d in each of the dimensions.

By continuing to dispose display tiles in rows and columns with an overlying portion of one display tile over an underlying portion of a neighboring display tile on one side of the display tile and a different underlying portion of the display tile disposed under a different neighboring tile on an opposite side of the display tile, the display of the present invention can be scaled to an arbitrary size in either of the two dimensions.

A flexible substrate or flexible cover is one in which the substrate or cover is made in one physical configuration and employed in the present invention in another physical configuration different from the manufacturing configuration, for example made in a flat configuration in which a display tile substrate surface is in a single plane and employed in an at least partially curved configuration, for example in which the tile surface is not in a single plane. A transparent substrate or cover is a substrate or cover that transmits at least 50% of incident light in the transparent tile areas (e.g. first and third transparent tile areas). The remainder of the substrate or cover need not be transparent except where light is emitted from the pixel array. The inter-pixel distance d is the distance between pixels within a pixel array on a display tile and the distance between the respective adjacent edge pixels of two separate display tiles in a dimension. The inter-pixel distance d can be different in the two dimensions.

Figure 20:
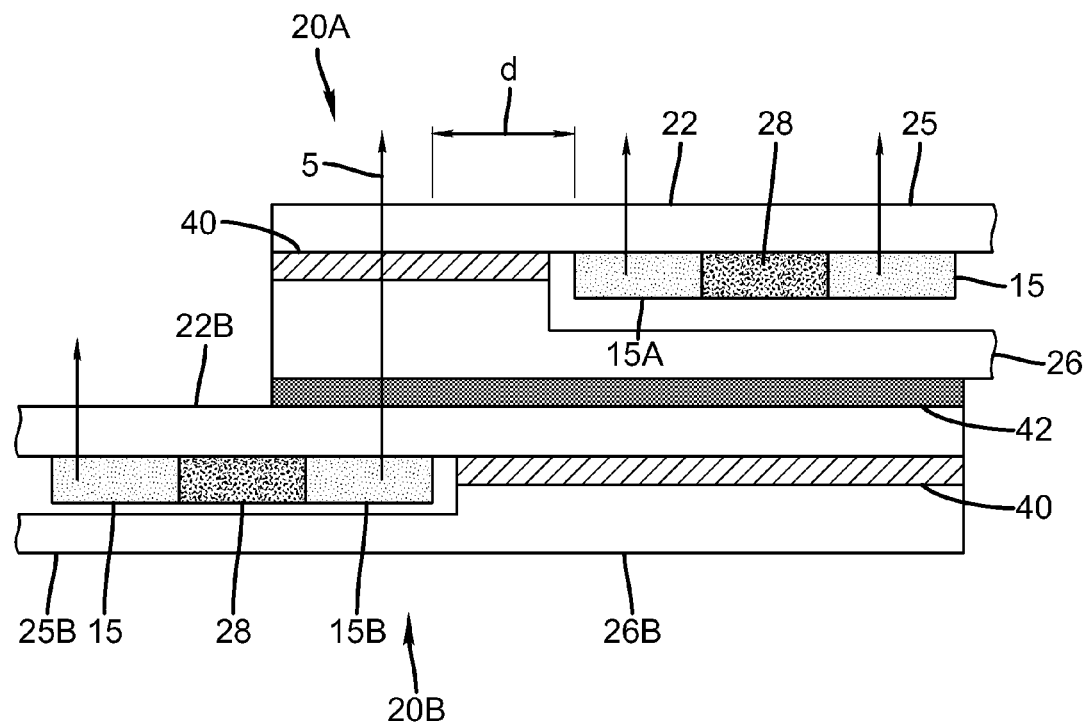
FIG. 20 is a partial cross section of the edges of two overlapping display tiles in a tiled display according to an embodiment of the present invention.

Referring to FIG. 20, a transparent encapsulating adhesive 40 can be used to adhere and align the cover and substrate of a display tile together, e.g. substrate 22B and cover 26B. An optical adhesive 42 can be used to adhere and align two display tiles together. The optical adhesive 42 in the light-emitting area of an edge pixel (e.g. 15B) is at least partially transparent and preferably has a refractive index matched to the index of the display tile cover 26 and substrate 22B. As used herein, the transparent flexible substrate 22 and transparent flexible cover 26 include any adhesive or encapsulating material employed to adhere the substrate and cover together or to adhere display tiles together, or any electrodes or electrical conductors that are located outside the pixel array of an overlapping portion of a display tile in the location of a pixel in the two-dimensional pixel array. The entire assembly of the display tile in the pixel locations outside the pixel array in the first and third transparent tile areas is transparent with the exception of any black matrix 28 material located between pixels, that is, in the inter-pixel area.

As shown in FIG. 3, each display tile 25 includes a transparent substrate 22 and a transparent cover 26 affixed to the transparent substrate 22. A first electrode 12 is formed over the transparent substrate 22, one or more layers 14 of light-emitting material are formed over the first electrode 12, and a second electrode 16 is formed over the one or more layers 14 of light-emitting material. In a bottom-emitter embodiment of the present invention (as shown in FIG. 3), the first electrode 12 can be transparent and the second electrode 16 can be reflective. Alternatively, in a top-emitter configuration (not shown) the first electrode 12 can be reflective and the second electrode 16 can be transparent. A color filter 18 can be included on either side of the substrate (for a bottom-emitter) or either side of the cover (for a top-emitter) to filter light 5 emitted by the one or more layers 14 of light-emitting material upon the application of a current through the one or more layers 14 of light-emitting material by the electrodes 12, 16. A black matrix material can be disposed between the pixels to absorb ambient light or stray emitted light, as shown in FIG. 2. The light emitted by the one or more layers 14 of light-emitting material can be white or can be colored. The one or more layers 14 of light-emitting material can be patterned or un-patterned; hence the color filters 18 are optional.

Figure 4:
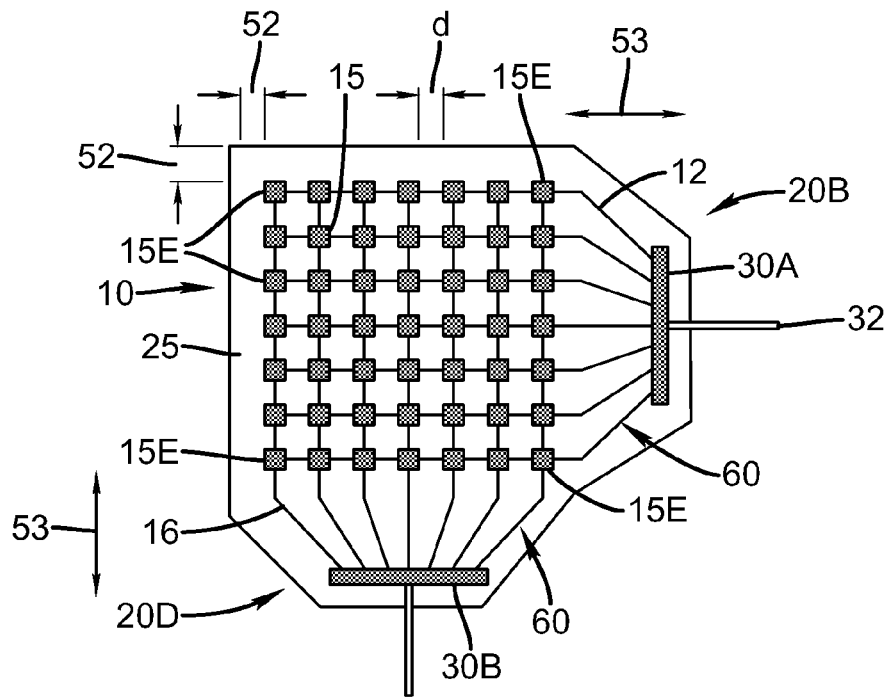
FIG. 4 is a plan view of one display tile in a tiled display according to an embodiment of the present invention.

Referring to FIG. 4, the first or second electrode 12, 16 is patterned to form independently-controllable light-emitting pixels 15, 15E arranged in rows and columns in a regular, two-dimensional, pixel array, the pixel array having edge pixels 15E located at the edge of the pixel array, each pixel 15, 15E separated from a neighboring pixel 15, 15E by an inter-pixel distance d in each of the two dimensions. The inter-pixel distance d in one dimension can be, but is not necessarily, the same as the inter-pixel distance d in another dimension. The pixels are located at grid points in a two-dimensional array, but not every grid point need have a pixel. In particular, the edge pixels can have a non-linear arrangement, as discussed further below. The pixels can be, but are not necessarily, square. For clarity, the figures show square pixels separated by a common inter-pixel distance d in both dimensions. The substrate and cover of display tile 25 extend beyond the pixel array on all four sides of the pixel array by a distance 52, 53 greater than the inter-pixel distance d in the respective dimension and on the respective side of the pixel array. As illustrated in the Figures, the display tiles can, but do not necessarily, extend farther beyond an edge pixel on one side of the pixel array (e.g. 52 for first and third tile areas 20A, 20C) than on the opposite side (e.g. 53 for second and fourth tile areas 20B, 20D). The farther extent of the display tile can be located beneath a neighboring display tile.

Figure 11:
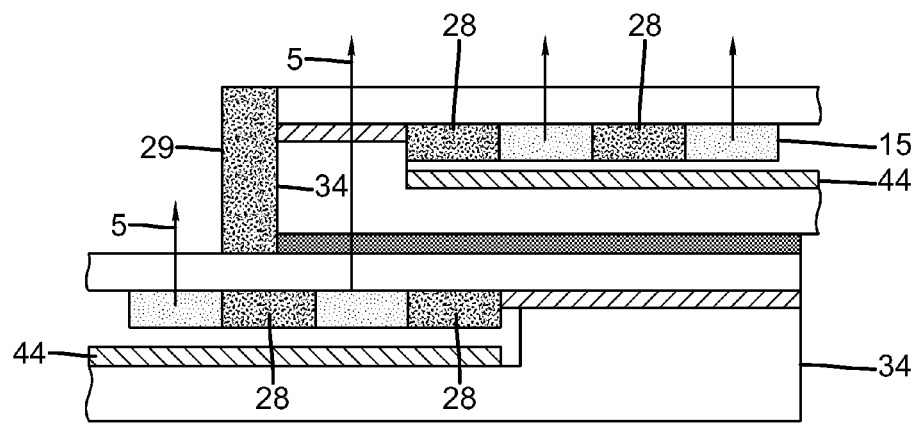
FIG. 11 is a partial cross section of the edges of two overlapping display tiles in a tiled display according to an embodiment of the present invention.

Referring to FIG. 11, the tiled electro-luminescent display apparatus in one embodiment further includes a black matrix material 28 formed on either side of the substrate or cover outside of the pixel array as well as inside the pixel array between pixels 15. Light-absorbing material 29 can also be disposed along the vertical edge 34 of the substrate and cover of a display tile. Such light-absorbing material absorbs ambient light to improve the display contrast. The light-absorbing material also absorbs stray light emitted by the pixels and prevents light from escaping from the vertical edge of the display tile substrate or cover. Desiccants 44 can be included to absorb moisture.

In one embodiment of the present invention, (e.g. as shown in FIG. 11) the first transparent tile area or the third transparent tile area has a vertical edge 34 that is located laterally between two pixels on the corresponding neighboring tile.

Figure 12:
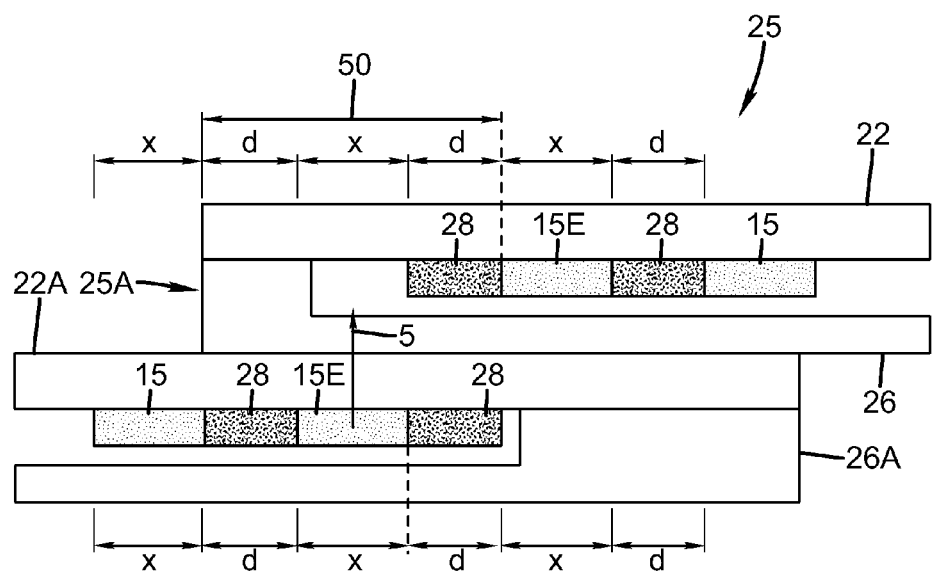
FIG. 12 is a partial cross section of the edges of two overlapping display tiles in a tiled display according to an alternative embodiment of the present invention.

In a related embodiment of the present invention in which the pixels have a common width, the extent in the direction corresponding to the pixel width of the display tile cover and substrate is matched to the pixel 15 and black matrix 28 layout over the substrates 22, 22A (FIG. 12). As illustrated in FIG. 12, the substrate and cover 22, 26 of a display tile 25 extends beyond a side of the pixel array a distance 50 greater than or equal to n(x+d) and less than or equal to n(x+d)+d, where n is a positive integer, x is the pixel width in the direction the substrate and cover extend beyond the side of the pixel array, and d is the inter-pixel distance in the corresponding direction the substrate and cover extend beyond the side of the pixel array. Such an arrangement will locate the display tile cover and substrate edge above or below the black matrix of a neighboring display tile (e.g. 25A). In this location, the display tile cover and substrate edge (and any light leaking from the display tile cover and substrate edge) are masked by the black matrix. Note that, where substrate 22A and cover 26A of display the 25A is disposed beneath display tile 25, its extent is not critical. However, where substrate 22 and cover 26 of display tile 25 are disposed above (in the direction of light emission) display tile 25A, the location of the substrate 22 and cover 26 edges with respect to the black matrix 28 and pixels 15, 15E of display tile 25A is important. In an alternative arrangement, the edges of the cover and substrate of a display tile with respect to the neighboring tile are disposed over a pixel so that light escaping from the edge can be masked by the light 5 emitted from a pixel.

In order to provide power to pixels and facilitate their control, it is necessary to electrically connect the pixel electrodes to controllers, typically integrated circuits. The electrical connections and, optionally, the controllers can be located on the same substrate as the pixel electrodes, providing a high level of integration. However, the electrical connections and controller can take space on the substrate greater than the inter-pixel distance d between pixels. Referring back to FIG. 4, in an embodiment of the present invention, the second tile area 20B and fourth tile area 20D of the display tile 25 substrate and cover extend a greater distance 53 on two adjacent sides of the pixel array 10 than distance 52 on the two sides of the pixel array opposing the two adjacent sides of the pixel array (i.e. first and third transparent tile areas 20A, 20C). An extended electrode portion 60 of the first or second electrodes 12, 16 extends a distance greater than the corresponding inter-pixel distance d on the second and fourth tile areas and the first or second electrodes 12, 16 do not extend a distance greater than the corresponding inter-pixel distance d beyond the pixel array on the two opposing sides of the pixel array. Hence, two adjacent sides of the display tile extend farther from the pixel array and can have electrical connections such as wires, and controllers, opaque or transparent, disposed thereon. The opposite sides do not have to extend farther because there are no electrical connections or controllers disposed on the opposite sides. According to an embodiment of the present invention, the second and fourth tile areas of a display tile are disposed beneath a neighboring display tile, and the opposing side first and third tile areas are disposed above a neighboring display tile on the opposite side. In this configuration, therefore, at least some of the extended electrode portion of a first display tile is disposed beneath the pixel array of a second display tile, thus hiding the electrodes and controller from view.

Figure 21:
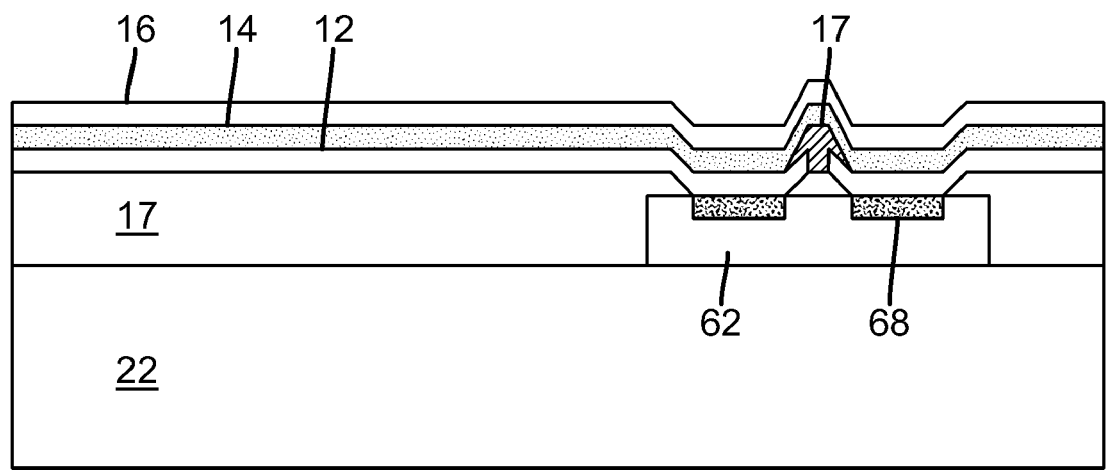
FIG. 21 is a partial cross section of a display tile having a chiplet controller according to an embodiment of the present invention.

FIG. 4 illustrates an embodiment having two controllers 30A, 30B and extended electrode portions 60 located on the second and fourth tile areas 20B, 20D of a display tile 25, one controller 30A controlling the row electrodes (e.g. 12) and the other controller 30B controlling the column electrodes (e.g. 16) in a passive-matrix control scheme. In FIG. 4, both the second and fourth tile areas 20B, 20D include a controller 30A or 30B and the respective electrodes controlled by the controllers. In an alternative embodiment illustrated in FIG. 5, second tile area 20B includes only the extended electrode portion 60A connecting pixel electrodes 12 to a controller 30 disposed on fourth tile area 20D. Fourth tile area 20D includes the extended electrode portion 60B connecting pixel electrodes 16 to the controller 30. Controller 30 is thus connected to extended electrode portions 60A and 60B, for example to row electrodes and column electrodes 12, 16 to control pixels 15 and edge pixels 15E. In an embodiment of the present invention, the one or more controllers are chiplets. Referring to FIG. 21, chiplets 62 are small, unpackaged, integrated circuits formed in or on a semiconductor substrate, such as silicon, separate from the flexible transparent display tile substrate 22 or cover (typically glass or plastic), not shown. The chiplets 62 can be printed on a display tile substrate 22 and connected to pixel electrodes 12, 16 and electrical connections with connection pads 68 using metal wires and photolithographic techniques known in the art, for example as disclosed in commonly assigned, currently pending U.S. patent application Ser. No. 12/372,906, filed Feb. 18, 2009. Insulating and planarizing layers 17 can be used to assist in the formation of electrical connections. A layer 14 of light-emitting material is formed between the pixel electrode 12, 16. In a further embodiment of the present invention, a first display tile controller can be electrically connected to a second display tile controller with a communication buss 64, (FIG. 6), for example a serial buss. The controllers can provide passive-matrix control to the pixels in each display tile (as illustrated in FIGS. 4 and 5), or can provide active-matrix control.

Figure 5:
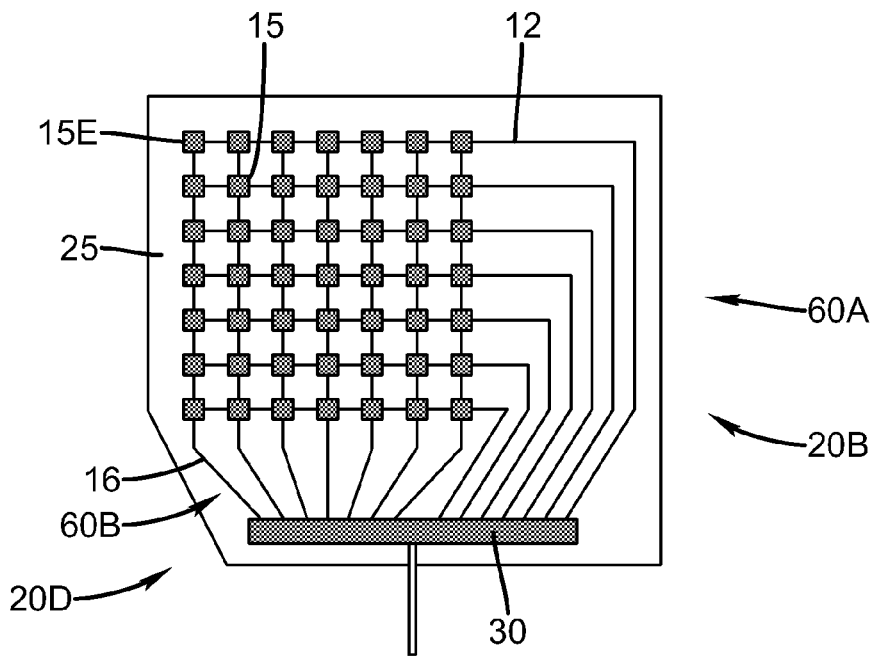
FIG. 5 is a plan view of an alternative display tile in a tiled display according to an embodiment of the present invention.
Figure 6:
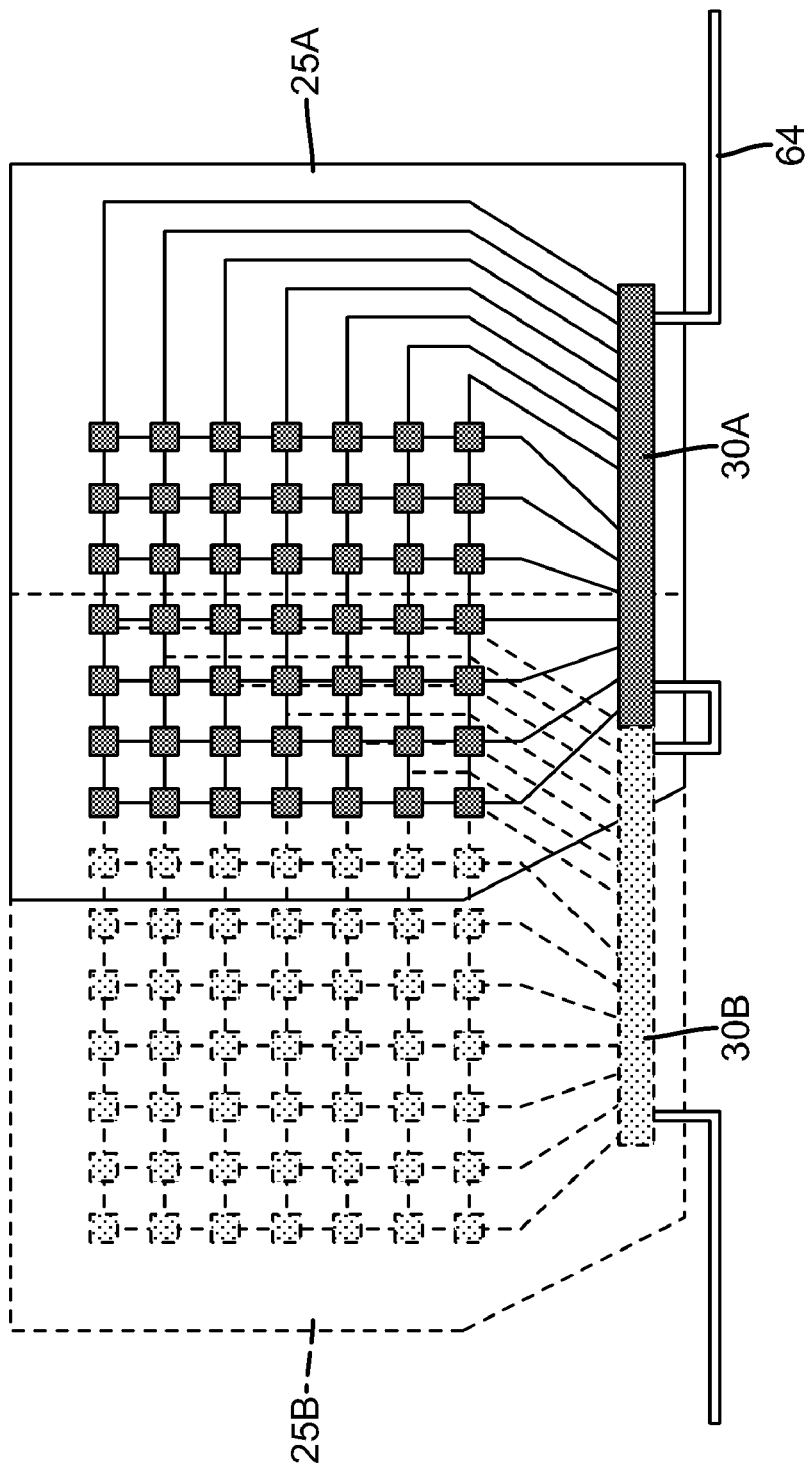
FIG. 6 is a plan view of two overlapping display tiles in a tiled display according to an embodiment of the present invention.

FIG. 6 is a plan view of two overlapping display tiles according to an embodiment of the present invention and corresponds to the arrangement of FIG. 5 and the side view of FIG. 20. The underlying display tile 25B is drawn with dashed lines to distinguish it from the overlying display tile 25A. At least a portion of the second tile area of the underlying display tile 25B is disposed beneath the pixel array of the overlying display tile 25A. Each display tile 25A, 25B includes a controller 30A, 30B respectively. The controllers for each display tile can be interconnected with a communication buss 64, for example a serial buss. Alternatively, other busses, such as parallel busses, can be used.

Figure 7:
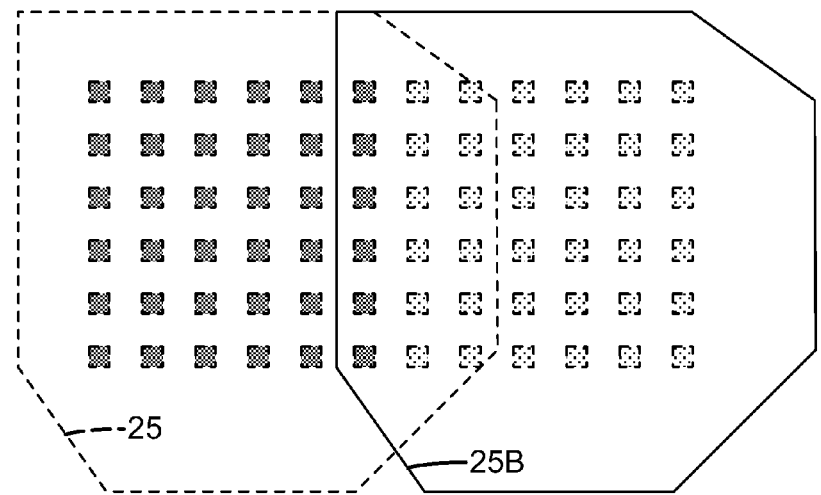
FIG. 7 is a simplified plan view of two overlapping display tiles in a tiled display according to an embodiment of the present invention.
Figure 8:
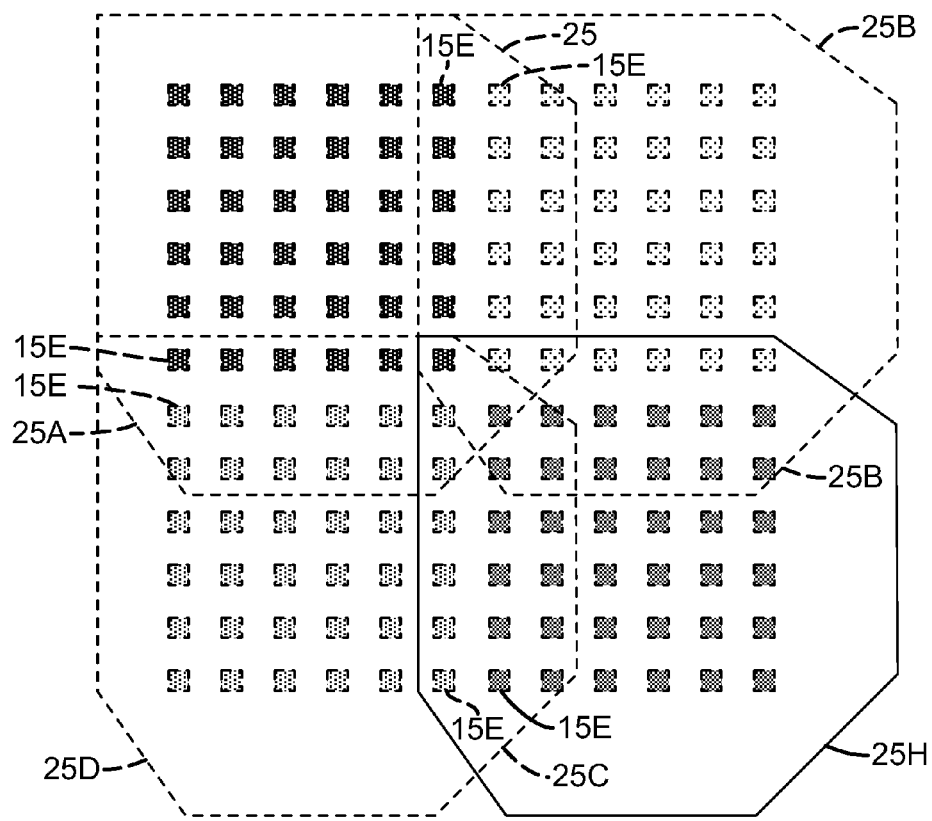
FIG. 8 is a simplified plan view of four overlapping display tiles in a tiled display according to an embodiment of the present invention.

In further embodiments of the present invention, many more display tiles can be incorporated into a display apparatus. Referring to FIG. 7, a simplified plan view of two display tiles 25 and 25B are shown, with a portion of the display tile 25 (second tile area) shown with dashed lines beneath a portion of the display tile 25B. Referring to FIG. 8, four display tiles, 25, 25B, 25D, 25H, referred to as first, second, third, and fourth, respectively, are shown aligned within a regular two-dimensional pixel and tile structure with edge pixels 15E indicated. Hence, the first and second display tiles 25 and 25B form a first row of display tiles. The third and fourth display tiles 25D and 25H form a second row of display tiles. First display tile 25 is shown at the bottom, with second display tile 25B overlapping the right hand portion (second tile area) of first display tile 25. Likewise, fourth display tile 25H is shown overlapping the right hand portion (second tile area) of third display tile 25D. Third display tile 25D overlaps a bottom portion (fourth tile area) of first display tile 25 and a smaller portion of second display tile 25B. Fourth display tile 25H is on the top. Hence, according to an embodiment of the present invention, a portion of a third display tile 25D (third tile area) is located above a portion of first display tile 25 so that at least one edge pixel 15E on a different side of the first display tile pixel array than the second display tile is adjacent to at least one edge pixel 15E on a side of the third display tile pixel array and separated from it by the corresponding inter-pixel distance, and at least a portion of the adjacent first display edge pixel(s) are located under the transparent substrate and cover of the third display tile so that light emitted by the adjacent edge pixel(s) of the first display tile 25 passes through the substrate and cover of the third display tile 25D.

Furthermore, a portion of a fourth display tile 25H is located above a portion of the second display tile 25B so that at least one edge pixel on a different side of the second display tile pixel array than the first display tile is adjacent to at least one edge pixel on a side of the fourth display tile pixel array and separated from it by the corresponding inter-pixel distance, and the adjacent second display edge pixel(s) are located under at least a portion of the transparent substrate and cover of the fourth display tile so that light emitted by the adjacent edge pixel(s) of the second display tile passes through the substrate and cover of the fourth display tile. A portion of the third display tile is located beneath a portion of the fourth display tile so that at least one edge pixel on a side of the third display tile pixel array is adjacent to at least one edge pixel on a side of the fourth display tile pixel array and separated from it by the corresponding inter-pixel distance, and the transparent substrate and cover of the fourth display tile are located over at least a portion of the adjacent third display edge pixel(s) so that light emitted by the adjacent edge pixel(s) of the third display tile passes through the substrate and cover of the fourth display tile. As shown in FIG. 8, light is also emitted through the substrate and cover of both the first and second display tile.

Figure 9:
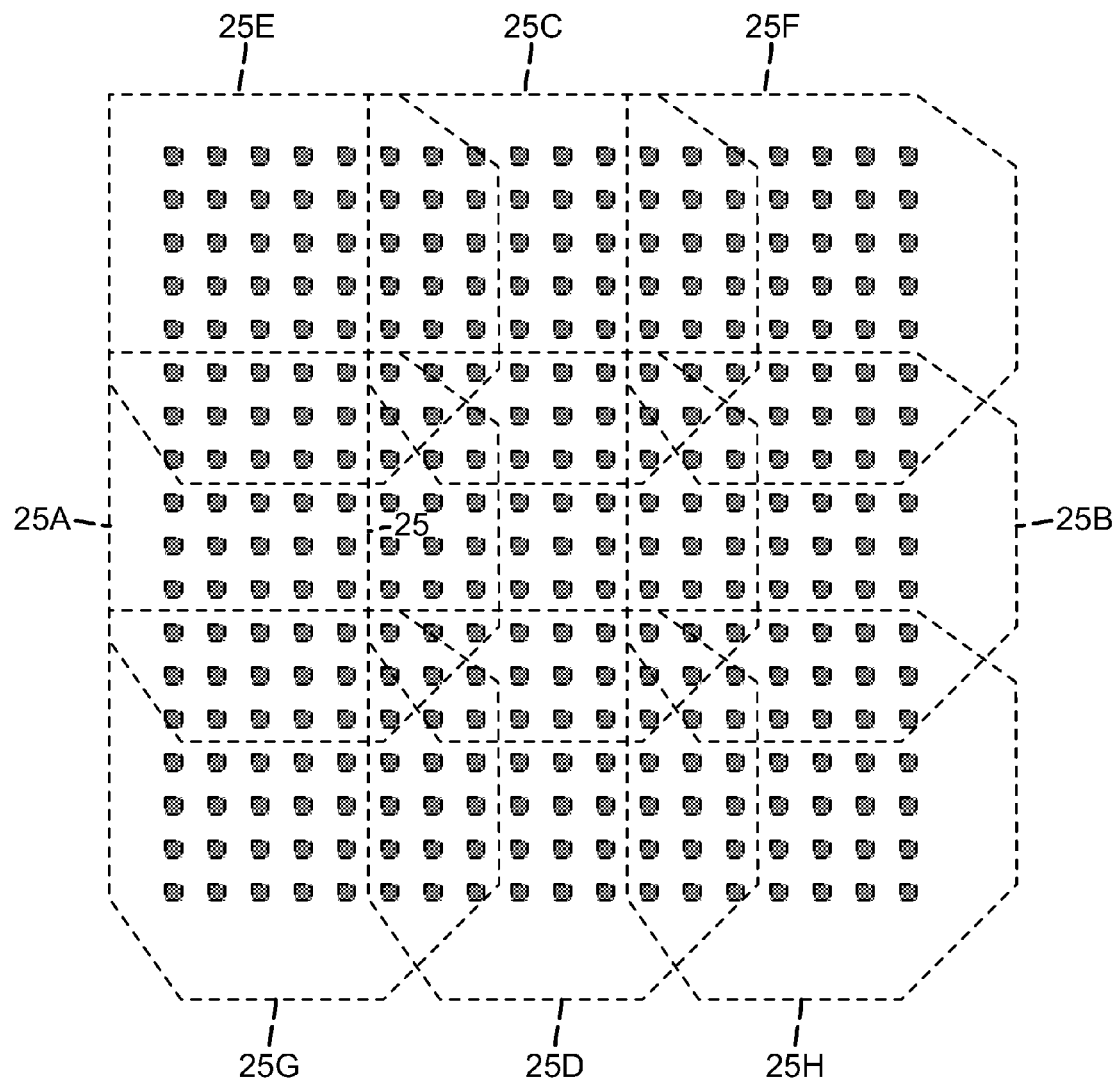
FIG. 9 is a simplified plan view of nine overlapping display tiles in a tiled display according to an embodiment of the present invention.

FIG. 9 (and in comparison with FIG. 1) shows a further extension of the tile structure to nine display tiles, a display tile 25 with eight neighboring display tiles 25A, 25B, 25C, 25D, 25E, 25F, 25G, and 25H. In this embodiment of the present invention, the tiled electro-luminescent display apparatus further includes fifth and sixth neighboring display tiles, 25E, and 25F. The first transparent tile area of the third neighboring display tile 25C is disposed above the second tile area of the fifth neighboring display tile 25E so that light emitted from the second edge pixels of the fifth neighboring display tile 25E is transmitted through the first transparent tile area of the third neighboring display tile 25C. The third transparent tile area of the first neighboring display tile 25A is disposed above the fourth tile area of the fifth neighboring display tile 25E so that light emitted from the fourth edge pixels of the fifth neighboring display tile 25E is transmitted through the third transparent tile area of the first neighboring tile 25A. The first transparent tile area of the sixth neighboring display tile 25F is disposed above the second tile area of the third neighboring display tile 25C so that light emitted from the second edge pixels of the third neighboring display tile 25C is transmitted through the first transparent tile area of the sixth neighboring display tile 25E. The third transparent tile area of the second neighboring display tile 25B is disposed above the fourth the area of the sixth neighboring display tile 25F so that light emitted from the fourth edge pixels of the sixth neighboring display tile 25F is transmitted through the third transparent tile area of the second neighboring tile 25B. Display tiles 25G, 25D, and 25I are similarly arranged with respect to display tiles 25A, 25, and 25B as display tiles 25A, 25, and 25B are with respect to display tiles 25E, 25C, and 25F. The pixels in the pixel arrays of the display tile and the nine display tiles do not overlap, form a regular, two-dimensional pixel array, and are separated by the respective inter-pixel distances in each of the dimensions.

Figure 10:
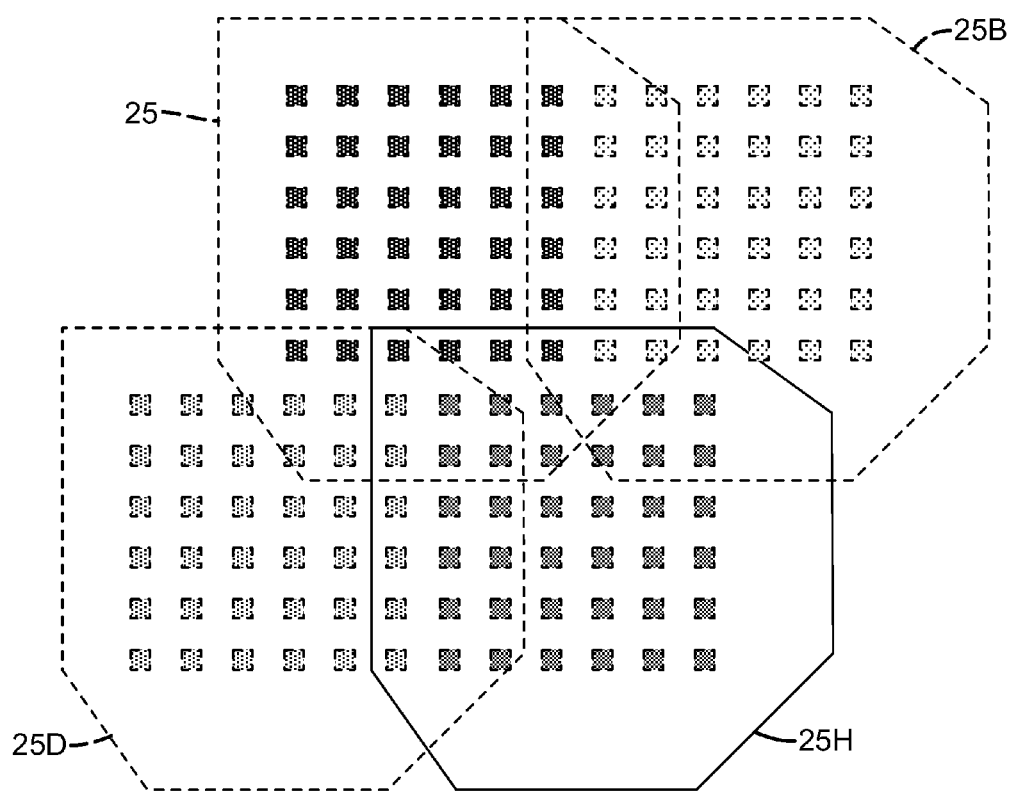
FIG. 10 is a simplified plan view of four overlapping display tiles with offset rows in a tiled display according to an embodiment of the present invention.

As illustrated in FIG. 8, edge pixels at the corners of the bottom-most display tile where four display tiles overlap can emit light through the substrate of the bottom display tile (25), the substrate and cover of a neighboring display tile (25B) on one side, the substrate and cover of a neighboring display tile (25D) on another, adjacent side, and the substrate and cover of a the top display tile (25H). To reduce the number of substrates and covers through which a pixel emits light, according to a further embodiment of the present invention illustrated in FIG. 10, the third and fourth display tiles (25D, 25H) are offset laterally with respect to the first and second display tiles (25, 25B). By offset is meant that display tiles aligned in rows are not likewise aligned in columns with adjacent rows. However, the pixels of all of the display tiles are still arranged in a regular two-dimensional array and have a common inter-pixel distance in each dimension.

According to the present invention, the cover and substrate of the display tiles are flexible. This flexibility permits the display tiles to be made when the substrate and covers are flat, for example having a surface in a single plane, simplifying the manufacturing process. Referring back to FIG. 19, once made, the display tiles are flexed to locate a first flat portion 24A of a first display tile 25 above a flat portion 24C of a second display tile 25A. At the edge of the flat, overlying portion 24A of display tile 25, a curved portion 24B of brings the remaining flat portion 24C of the display tile 25 into the same plane as the flat portion 24C of neighboring display tile 25A. Since the flat portion 24C of display tile 25 is much larger than the flat portion 24A of display tile 25, the display tile substrates will generally be located in a common plane, with the exception of the smaller, flat portions 24A that overlie neighboring display tiles and the curved portions 24B near the edge of the display tiles. In an embodiment of the present invention, the pixels of the larger flat portions (e.g. 24C) are parallel to a viewing plane or are actually in a viewing plane. The smaller flat portions (24A) can also be parallel to the same viewing plane, but slightly offset in the viewing direction.

Figure 13:
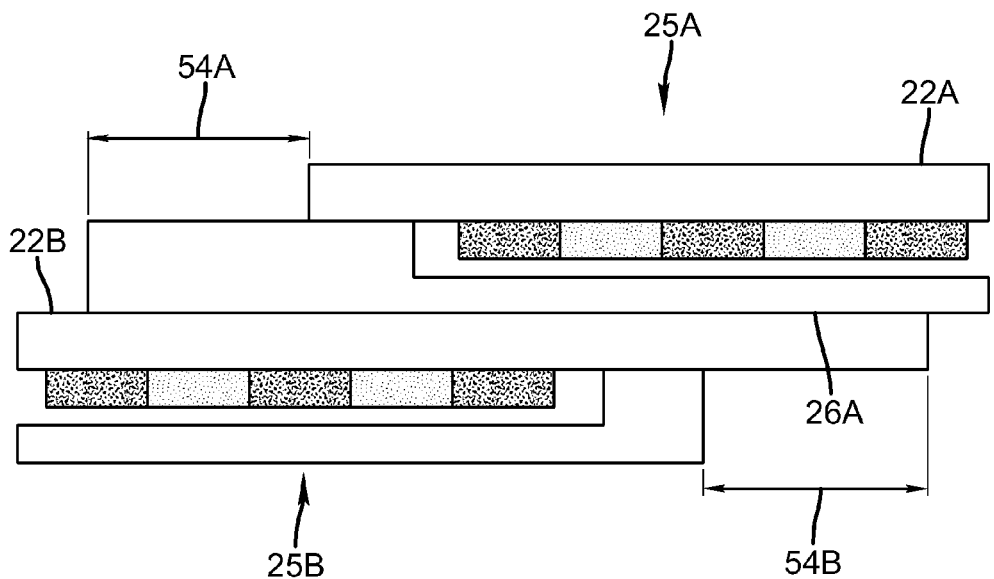
FIG. 13 is a partial cross section of the edges of two overlapping display tiles in a tiled display wherein the cover and substrate extend a different distance over the tile edge according to an alternative embodiment of the present invention.

In one embodiment of the present invention, illustrated in the side view of FIG. 13, the vertical length of a display tile edge in a single plane is reduced by making the cover and substrate of the display tiles have different sizes and be located in different planes so that the substrate extends a distance beyond the edge of the cover or so that the cover extends a distance beyond the edge of the substrate. In FIG. 13, the cover 26A extends a distance 54A farther than the substrate 22A of display tile 25A. In contrast, the substrate 22B of display tile 25B extends a distance 54B farther than the cover 26B. By using different-sized substrates and covers, light that leaks from either the cover or edge is more widely dispersed and less visible.

Figure 14A:
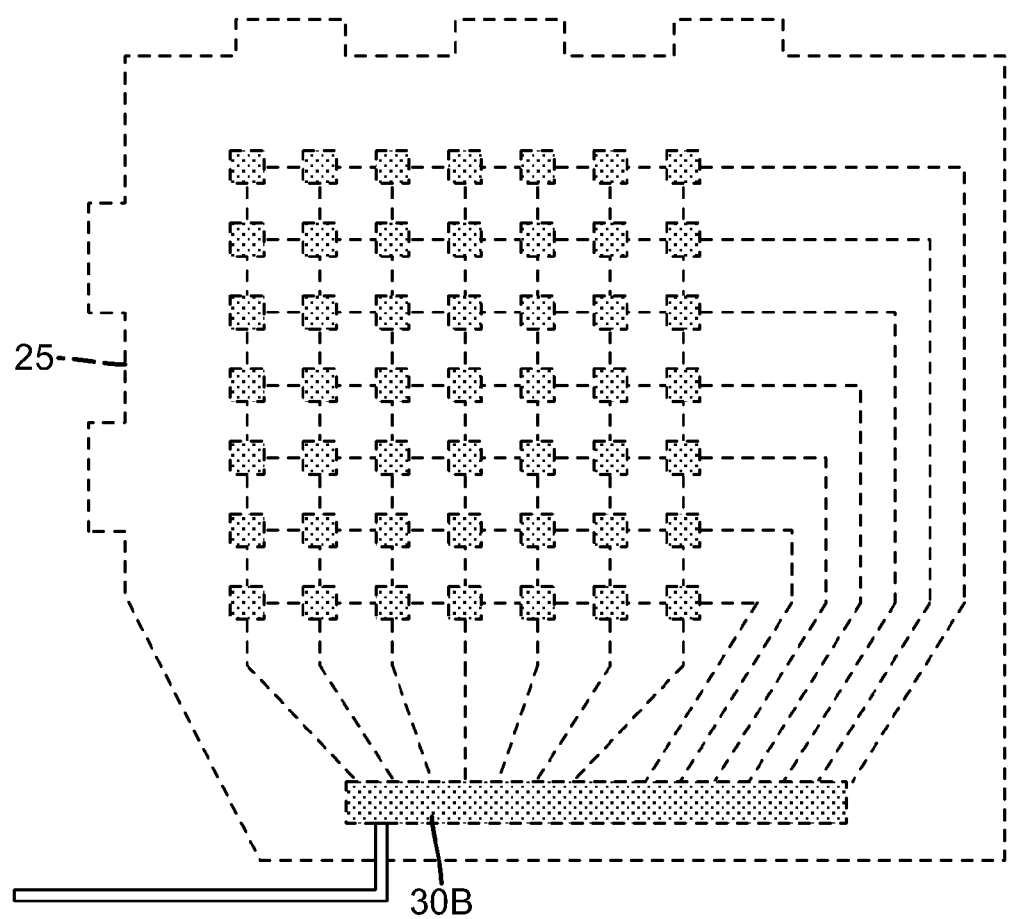
FIGS. 14A and 14B are plan views of a display tile that has jagged or stepped edges according to alternative embodiments of the present invention.
Figure 14B:
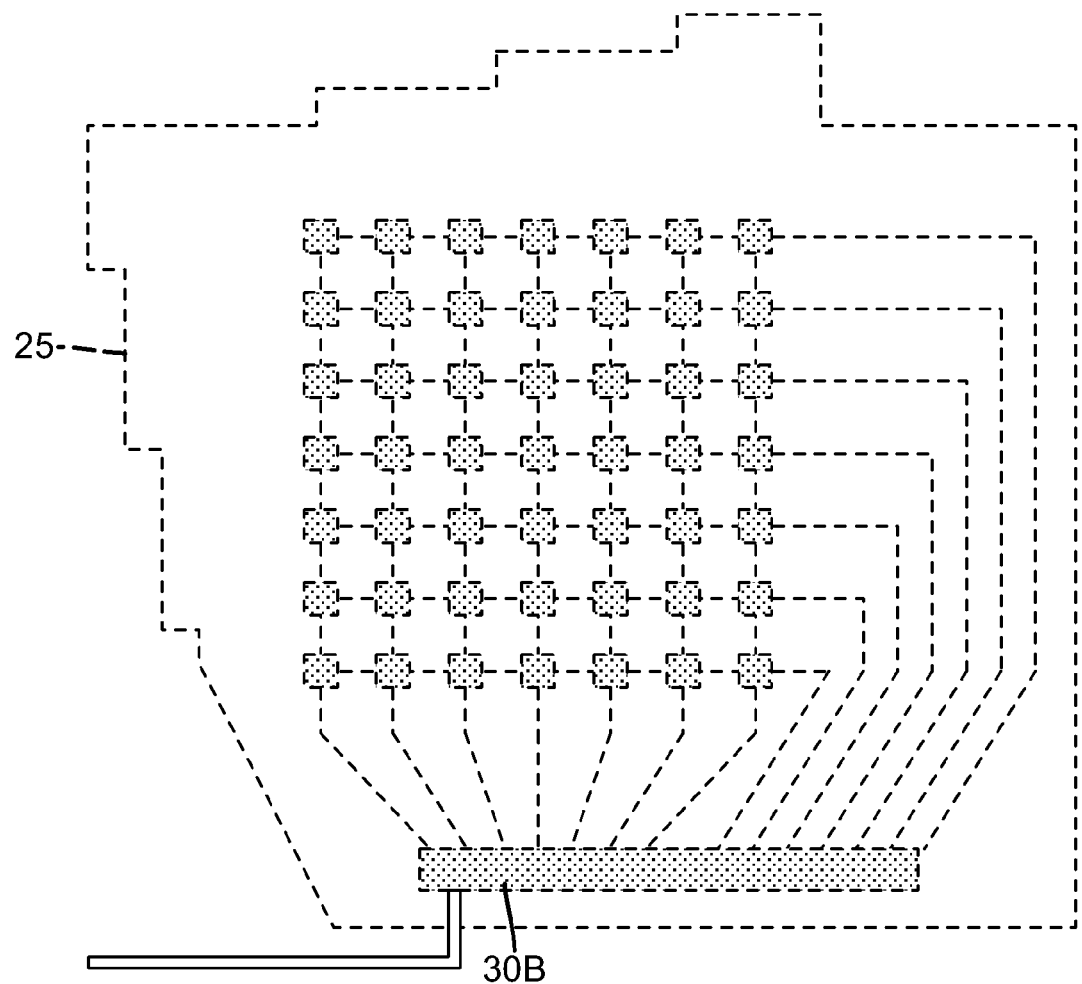

In other embodiments of the present invention illustrated in FIGS. 14A and 14B, the edges of the cover and substrate of the display tiles 25 are jagged or stepped. In FIG. 14A, the edge forms a repeating pattern of crenellations, and in FIG. 14B, the edge forms steps. Since long, straight edges are readily perceived by the human visual system, using jagged or stepped edges on one or more sides of a display tile reduces the visibility of an edge in a tiled display apparatus. The changes in edge direction can be mutually orthogonal and can be done in increments of pixel widths, inter-pixel distance d, or the sum of the two.

As is known in the tiled-display art, visible seams between display tiles are objectionable. These visible seams can result from irregular pixel layout, non-uniform light output at the edges, changes in ambient reflection at the display tile edges, and emitted-light leakage from the tile edges. These difficulties are substantially mitigated by the present invention. By using flexible transparent substrates and covers, one display tile edge can be located beneath a neighboring tile. Furthermore, the display tile portion located beneath a neighboring tile can be increased in size to provide additional space for controllers and wire routing. Therefore, in a bottom-emitter configuration, wires do not have to be located between the pixels, thereby improving the aperture ratio and the lifetime of a bottom-emitter electroluminescent display. By employing area-emissive electroluminescent materials, the light output is Lambertian and therefore the light emitted from the curved portion of the display tile is indistinguishable from that emitted from flat portions. By providing transparent substrates and covers, light from one display tile can be emitted through the substrate and cover of an overlying display tile, thereby enabling wide edges at the display tile perimeter. These wide edges are easier to make and provide wider seals to prevent the ingress of harmful moisture, either through the encapsulating adhesive or through the substrate itself. Since flexible substrates typically employ plastics, for example polyethylene teraphthalate (PET) or polyethylene naphthalate (PEN), moisture ingress through the plastic itself can be a problem. By providing a wide edge, the lifetime of the device can be increased. Furthermore, flexible substrates and covers can be very thin, for example 50 microns, compared to glass or other inorganic substrates, as well as flexible. A thin substrate and cover reduces the visibility of a display tile edge, especially when viewed at an angle other than the normal to a flat substrate portion. Both the reflection and refraction of ambient light and the reflection and refraction of emitted light from a vertical edge are reduced.

According to a further embodiment of the present invention, therefore, either or both of the substrate or cover has a thickness equal to or less than the inter-pixel distance in one or both dimensions. Alternatively, either or both of the substrate or cover have a thickness equal to or less than the pixel width in at least one dimension. FIG. 20 illustrates the cases where the substrate is thinner than either of the interpixel distance or the pixel width.

Figure 15:
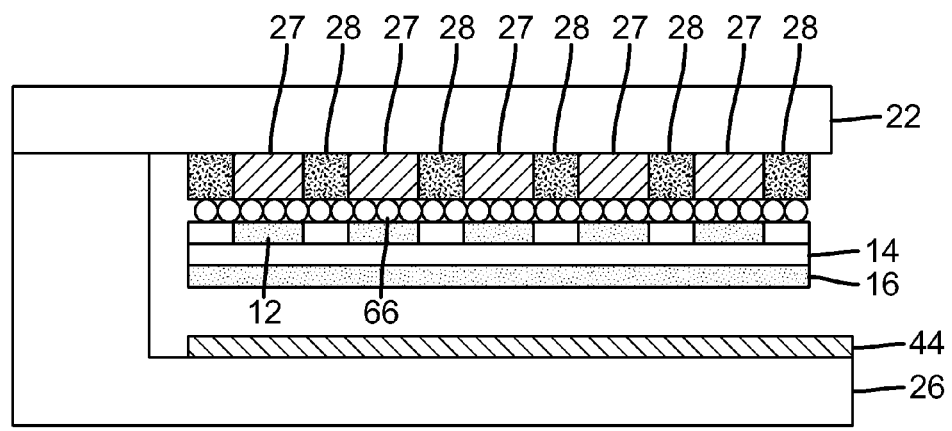
FIG. 15 is a partial cross section of the edges of a display tile that includes a light-scattering layer and color filters according to an alternative embodiment of the present invention.

It is known in the art that a thin cover or substrate reduces the loss of sharpness that can be found when employing diffusing layers to extract trapped light from the pixels in an electroluminescent display. According to another embodiment of the present invention, therefore, an emitted-light-diffusing element can be optically integrated with the one or more layers of light-emitting material. Referring to FIG. 15, an emitted-light-diffusing element 66 is optically integrated with the one or more layers 14 of light-emitting material in an OLED pixel. By optically integrated with a layer is meant that any light trapped in the layer is redirected by the emitted-light-diffusing element. By employing such an emitted-light-diffusing element, any emitted light trapped within the layers 14 of light-emitting material, electrodes 12, 16, substrate 22, or cover 26 can be emitted from the display tile, thereby improving the efficiency of the display. Because the display tile cover and substrate thickness can be much smaller than the inter-pixel distance d or pixel width, the display tile sharpness is maintained.

It is a further advantage of the present invention that displays and display tiles can be made at low cost. As is known in the OLED display art, patterning light-emitting materials over a large substrate is difficult and expensive. In yet another embodiment of the present invention, therefore, a display tile can further include an array of color filters located in correspondence with the pixels and a black matrix located between the color filters, and wherein the one or more layers of light-emitting material are unpatterned and emit white light to form a full-color tiled display. Referring again to FIG. 15, a display tile includes a substrate 22 on which is formed light-absorbing material at the edge of the pixel array and black-matrix 28 and color-filter elements 27 within the pixel array and in correspondence with the patterned pixel-controlling electrodes 12 and common electrode 16. Over the black-matrix 28 and color-filter elements 27 are located a light-scattering layer forming an emitted-light-diffusing element 66. This element 66 can be disposed in other locations, for example on either side of the substrate or in optical contact with the electrode 16. An OLED device including a first patterned electrode 12, one or more layers of light-emitting material 14, and a second common electrode 16 are formed over the emitted-light-diffusing element 66 or the black matrix 28 and color filters 27. An encapsulating cover 26 is adhered to the substrate 22. A desiccant 44 can be employed within the encapsulating cover 26 to absorb moisture.

In operation, an image, for example a digital image, is supplied by an external image source through a connection buss connecting controllers on each of a plurality of display tiles arranged as described above. The controllers produce signals for driving the display tile pixels according to the image information. The signals are transmitted onto row and column electrodes formed over the display tile substrate causing the pixels to emit light. In most of the display tile pixel areas, the pixels emit light directly from the tiled display apparatus. However, any edge pixels that are disposed beneath an overlying display tile will emit light through the overlying display tile.

The present invention has the advantage of providing a scalable display apparatus that can be arbitrarily extended. The edges can be large and the display tiles can readily incorporate electrode and electrical buss lines on the substrate, as well as controllers, without reducing the aperture ratio of the display tiles in the pixel area. By employing thin, flexible display substrates with electroluminescent emitters, light emission from the pixels is uniform and the visibility of the display tile seams greatly reduced. Furthermore, sharpness is maintained even when light-diffusing elements are employed to improve light output. Moreover, environmental protection for organic materials in the one or more layers of light-emitting material is improved. By employing chiplets with independent substrates (e.g. comprising crystalline silicon) to control the display tiles, higher performance and smaller size can be achieved than is found with conventional thin-film circuitry. Flexible substrates, especially substrates including polymers, typically have a low-process temperature threshold. Chiplets made independently on a separate substrate and then printed onto a flexible display tile substrate do not impose the same high temperature process requirements as conventional thin-film circuitry, thereby enabling high-performance circuits on flexible substrates with a high degree of integration at relatively low cost. Such chiplets can have a thickness of less than 100 microns or less than 20 microns, e.g. 12 microns.

Figure 16:
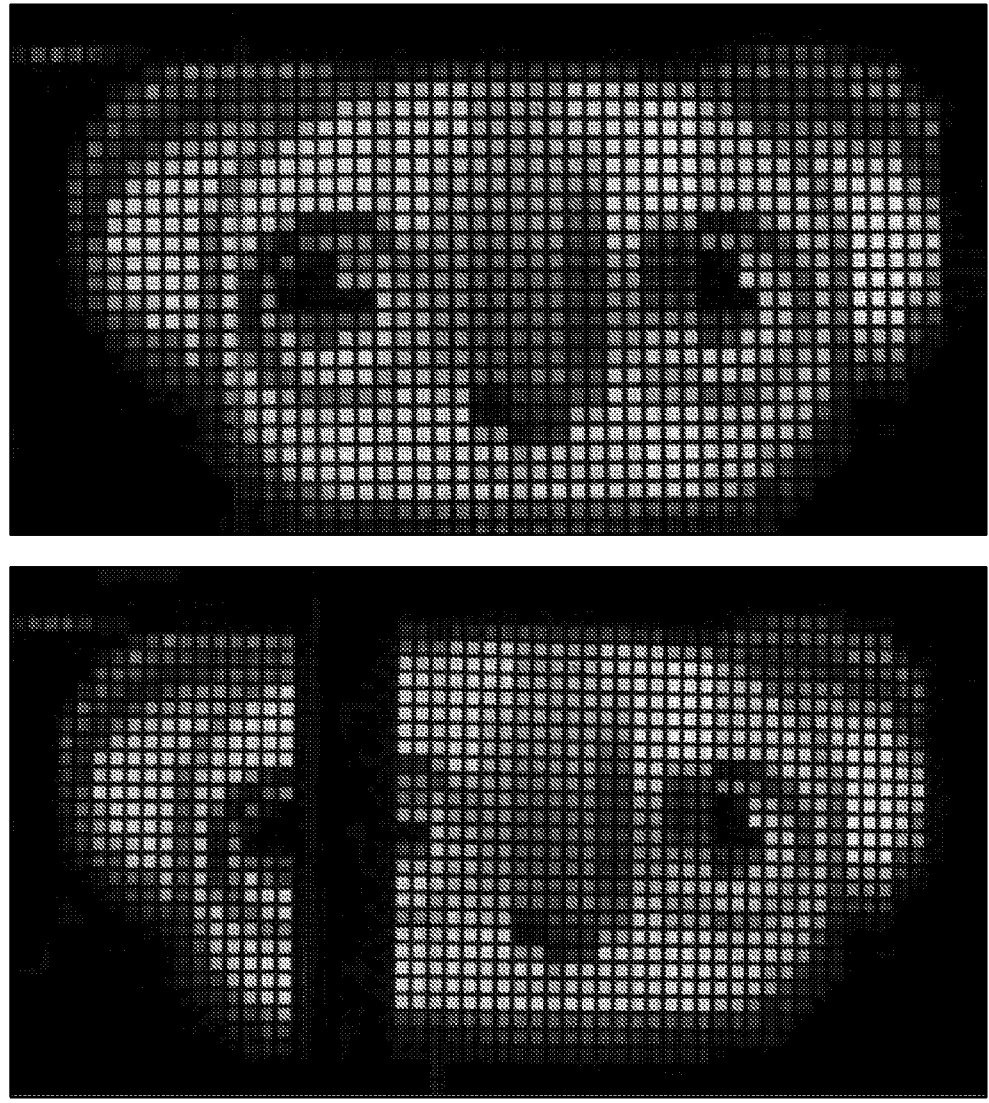
FIG. 16 is two photographs of a tiled display having two display tiles according to an embodiment of the present invention.

FIG. 6 shows a diagram of a display apparatus constructed according to an embodiment of the present invention. The display tiles were constructed on PET substrates with moisture barrier layers and the same material used for the encapsulating cover. Each tile had a 32×32 array of green-light emitting OLEDs. FIG. 16 shows two photographs of the display apparatus in operation with two display tiles, overlapped as described above. The lower image is that of a koala with the two display tiles separated to indicate the image portion displayed on each display tile. The upper image is that displayed by the combined display tile structure. When the display tiles are carefully aligned, no seam is visible at a designed viewing distance. Moreover, the light emitted by the underlying edge pixels is not visibly different from other pixels.

FIG. 8 shows a diagram of a display apparatus constructed according to another embodiment of the present invention with four display tiles and one controller per display tile. This apparatus uses vertical black light-absorbing material and demonstrates that the edge pixels at the bottom of the four-display-tile stack are not visibly different from other pixels in the pixel arrays. Some light leakage from the display tiles can be seen under magnification at an angle to the normal, but at a designed viewing distance, no display tile seam was visible and no ambient light non-uniformity observed.

In an additional embodiment of the present invention, luminance uniformity can be ensured by adjusting the source image data sent to each tile so that the emissions from pixels with overlying tiles is compensated for the light absorptions in the additional layers of substrates, encapsulating covers, or adhesive.

Figure 17:
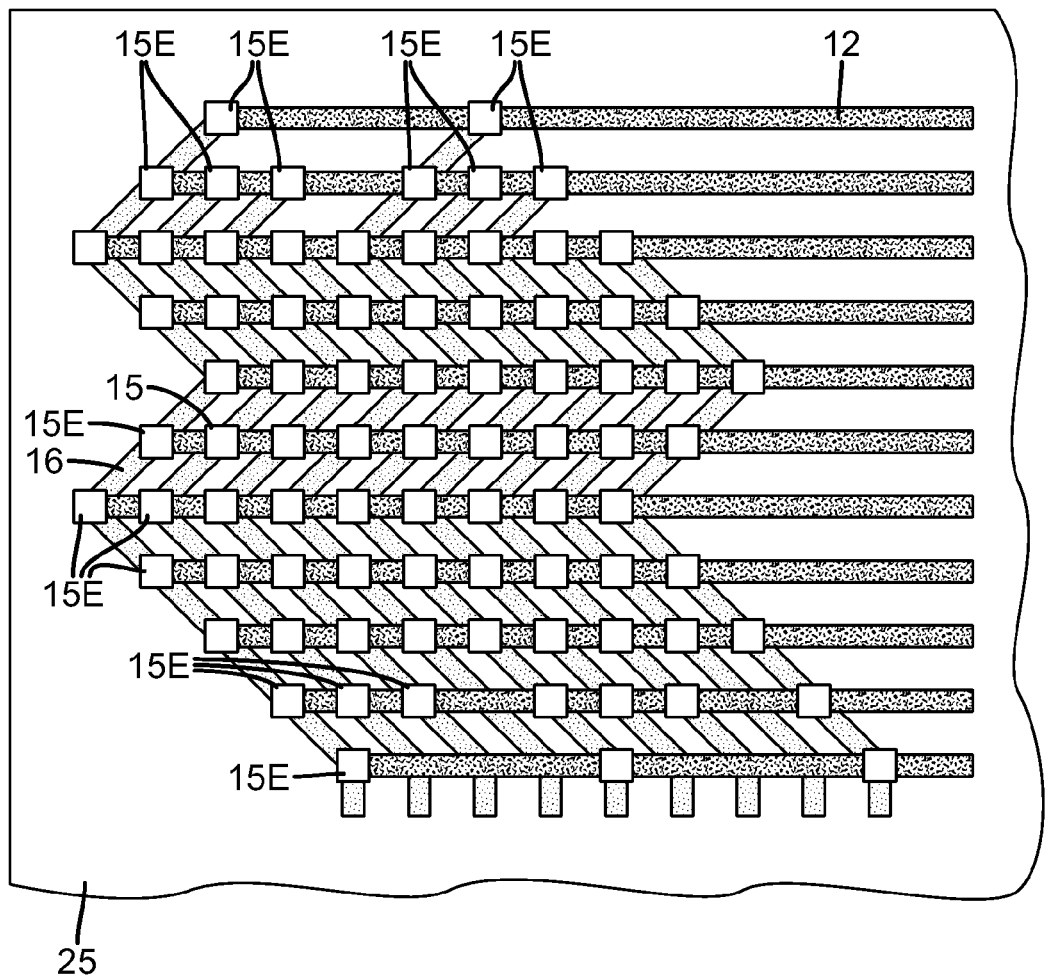
FIG. 17 is a schematic of a partial tiled display having jagged pixel edges according to an embodiment of the present invention.
Figure 18:
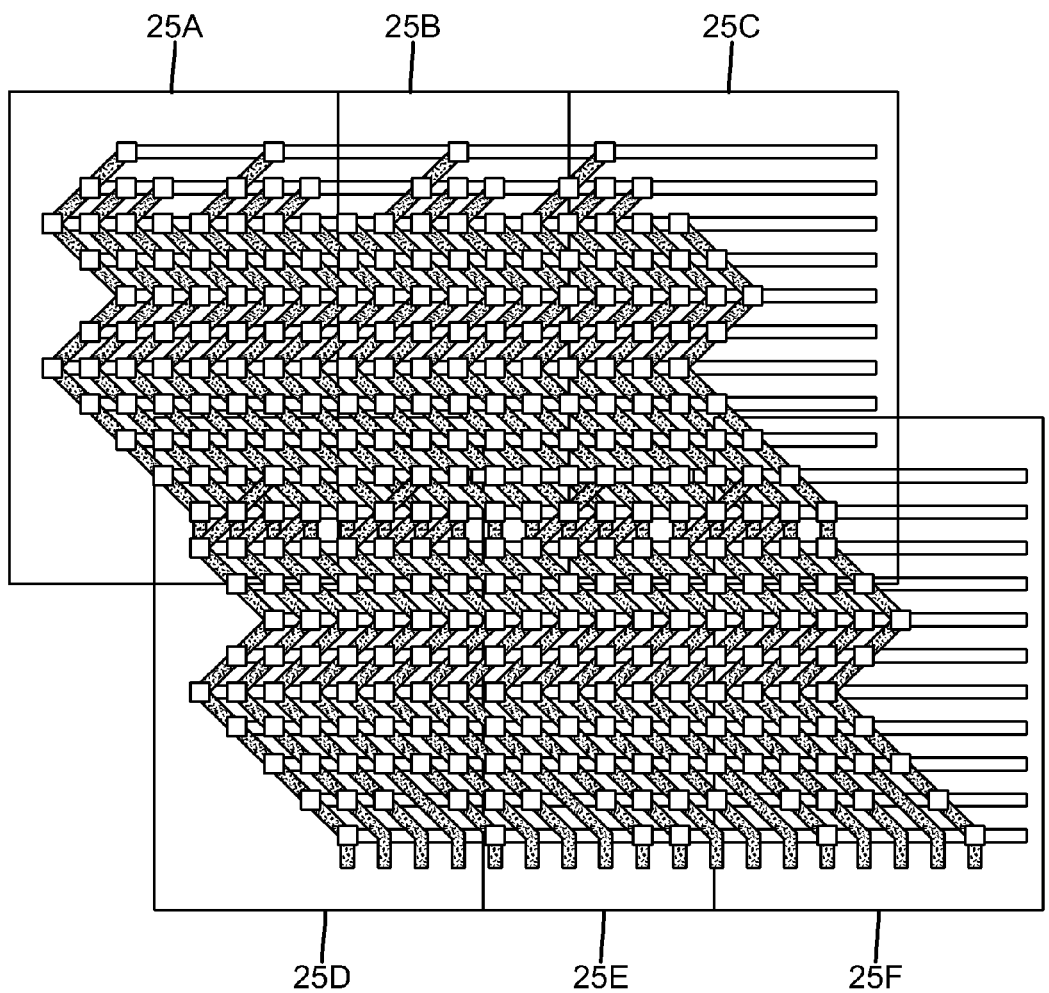
FIG. 18 is a schematic of the partial tiled displays of FIG. 17 in a tiled arrangement according to an embodiment of the present invention.

The pixel array of the present invention forms a two-dimensional, array. Each location in the array can include a pixel so that the pixels form a rectangular grid. An additional advantage of the current invention, however, is that the wider perimeter around the pixel array can be used to create non-rectangular arrays of pixels such that the tile-to-tile boundary between adjacent pixels will be more difficult to detect visually. In this embodiment of the present invention, light-emitting pixels in a display tile need not be located at every pixel array location. Instead, the entire multi-tile display includes pixels located at each point in the array. Within a single display tile, the pixels can be arranged at some, but not all, of the array locations in the two-dimensional grid. Edge pixels can be disposed in an irregular pattern as discussed in U.S. Pat. No. 6,881,946. Arrays of pixels that have non-straight sides hide variations in alignment and luminance. For example, as shown in FIG. 17, a display tile can have a non-linear saw-tooth pixel pattern on the edges of the pixel array. In this embodiment of the present invention, a display tile 25 can have electrodes 12 that are transparent and electrodes 16 that are reflective. The overlapping portions of electrodes 12 and 16 form a two-dimensional grid pattern of pixels 15, 15E that can be driven with a passive-matrix control. Edge pixels 15E include all pixels that emit light through the substrate and cover of a neighboring display tile and are not necessarily on the outer-most row or column of the pixel array. The two-dimensional tiling of six display tiles having jagged pixel edges is shown in FIG. 18 for display tiles 25A, 25B, 25C, 25D, 25E, 25F.

The flexible substrates and covers of the display tiles of the present invention can include, for example, polymers such as PET or PEN. Inorganic barrier layers can be formed as part of the substrates and covers to inhibit the ingress of environmental contaminants, such as moisture. Transparent, flexible covers can include thin-film layers coated directly over or onto a substrate or can include separately constructed films that are adhered to a substrate. Pixels can include, for example, aluminum or silver reflective electrodes and metal oxide, such as indium tin oxide, aluminum zinc oxide or indium zinc oxide, transparent electrodes. Such conductors can be deposited on a substrate by sputtering or evaporation and patterned with a mask or by photolithography. Metal wires can also be formed from evaporated or sputtered metal and patterned with masks or photolithography. Alternatively, cured conductive inks can be employed to construct electrical conductors. Light-emitting layers and charge-control layers can include organic or inorganic materials as is known in the OLED art, and can be deposited by evaporation and, if patterned, deposited through a mask. Transparent adhesives and encapsulating adhesives are known in the art.

The present invention can be employed in devices having a multi-pixel infrastructure. In particular, the present invention can be practiced with LED devices, either organic or inorganic, and is particularly useful in information-display devices. In a preferred embodiment, the present invention is employed in a tiled, flat-panel array of OLED devices composed of small-molecule or polymeric OLEDs as disclosed in, but not limited to U.S. Pat. No. 4,769,292, to Tang et al., and U.S. Pat. No. 5,061,569 to Van Slyke et al. Inorganic devices, for example, employing quantum dots formed in a polycrystalline semiconductor matrix (for example, as taught in U.S. Patent Application Publication No. 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having a top-emitter architecture or having a bottom-emitter architecture.

The invention has been described in detail with particular reference to certain preferred embodiments thereof, but it will be understood that variations and modifications can be effected within the spirit and scope of the invention.

PARTS LIST d inter-pixel distance
x pixel width
5 light
10 pixel array, display area
12 first electrode
14 layers of light-emitting material
15 light-emitting pixel
15A first edge pixel
15B second edge pixel
15C third edge pixel
15D fourth edge pixel
15E edge pixel
16 second electrode
17 planarizing insulator layer
18 color filter
20A first transparent tile area
20B second tile area
20C third transparent-tile area
20D fourth tile area
21A first transparent tile area
21B second tile area
22 substrate
22A substrate
22B substrate
24A flat display tile portion
24B curved display tile portion
24C flat display tile portion
25 display tile
25A neighboring display tile
25B neighboring display tile
25C neighboring display tile
25D neighboring display tile
25E display tile
25F display tile
25G display tile
25H display tile
26 cover
26A cover
26B cover
27 color filter
28 black matrix
29 light-absorbing material
30 controller
30A row controller
30B column controller
32 buss
34 vertical edge
40 encapsulating adhesive
42 optical adhesive
44 desiccant
50A range indicator
50B range indicator
50 distance 51 distance
52 distance
53 distance
54A distance
54B distance
60 extended electrode portion
60A extended electrode portion
60B extended electrode portion
62 chiplet
64 communication buss
66 light-diffusing element
68 connection pad

The invention claimed is:

1. A tiled electro-luminescent display apparatus, comprising:
   (a) a plurality of display tiles arranged in a regular two-dimensional array, each display tile including:
      i) a transparent flexible substrate and a transparent flexible cover affixed to the transparent flexible substrate;
      ii) a first electrode formed over the transparent flexible substrate, one or more layers of light-emitting material formed over the first electrode, and a second electrode formed over the one or more layers of light-emitting material;
      iii) wherein the first or second electrode forms independently-controllable light-emitting pixels arranged in rows and columns of a regular, two-dimensional, four-sided pixel array defining a display area, the pixel array having first edge pixels located on the edge of a first side of the pixel array, second edge pixels located on the edge of a second side of the pixel array opposite the first side, third edge pixels located on the edge of a third side of the pixel array adjacent to the first and second sides, and fourth edge pixels located on the edge of a fourth side of the pixel array opposite the third side and adjacent to the first and second sides, each pixel separated from a neighboring pixel by a respective inter-pixel distance in each of the two dimensions;
      iv) wherein the transparent flexible substrate or transparent flexible cover extends beyond the pixel array on all four sides of the pixel array a distance greater than the inter-pixel distance in respective dimensions, the transparent flexible substrate or transparent flexible cover extensions defining a first transparent tile area on the first side of the pixel array, a second tile area on the second side of the pixel array opposite the first side, a third transparent tile area on the third side of the pixel array adjacent to the first and second sides, a fourth tile area on the fourth side of the pixel array opposite the third side and adjacent to the first and second sides; and
      v) wherein the first transparent, second, third transparent and fourth tile areas do not include pixels; and
   (b) wherein the display tiles are arranged so that:
      i) the first transparent tile area of each display tile is disposed above the second tile area of a first neighboring display tile so that light emitted from the second edge pixels of the first neighboring display tile is transmitted through the first transparent tile area,
      ii) the second tile area of each display tile is disposed below the first transparent tile area of a second neighboring display tile so that light emitted from the second edge pixels is transmitted through the first transparent tile area of the second neighboring tile;
      iii) the third transparent tile area of each display tile is disposed above the fourth tile area of a third neighboring display tile so that light emitted from the fourth edge pixels of the third neighboring display tile is transmitted through the third transparent tile area; and
      iv) the fourth tile area of each display tile is disposed below the third transparent tile area of a fourth neighboring display tile so that light emitted from the fourth edge pixels is transmitted through the third transparent tile area of the fourth neighboring tile; and
      v) wherein the pixels in the pixel arrays of each display tile and the first, second, third and fourth neighboring display tiles do not overlap, form a regular, two-dimensional pixel array, and are separated by the respective inter-pixel distances in each of the dimensions,
   wherein the transparent flexible substrate and transparent flexible cover of the display tiles have respective edges and wherein the transparent flexible substrate and transparent flexible cover of the display tiles have different sizes so that the transparent flexible substrate extends beyond the edge of the transparent flexible cover, or the transparent flexible cover extends beyond the edge of the transparent flexible substrate, on one or more sides.

2. The tiled electro-luminescent display apparatus of claim 1, further including a black matrix material formed on the transparent flexible substrate or transparent flexible cover in the first transparent, second, third transparent or fourth tile areas of one or more display tiles.

3. The tiled electro-luminescent display apparatus of claim 1, wherein the transparent flexible substrate or transparent flexible cover has a vertical edge, and further including a black matrix material located on a vertical edge of the transparent flexible substrate or transparent flexible cover.

4. The tiled electro-luminescent display apparatus of claim 1, wherein the first transparent tile area or the third transparent tile area has a vertical edge that is located laterally between two pixels on a corresponding neighboring tile.

5. The tiled electro-luminescent display apparatus of claim 1, a) wherein the second and fourth display tile areas are larger than the first and third transparent tile areas, respectively; and b) the first or second electrode has an extended electrode portion extending a distance greater than the corresponding inter-pixel distance into the second or fourth tile area, and the first or second electrode does not extend a distance greater than the corresponding inter-pixel distance into the corresponding first or third transparent tile area.

6. The tiled electro-luminescent display apparatus of claim 5, wherein at least a portion of the second tile area is disposed beneath the pixel array of the second neighboring display tile.

7. The tiled electro-luminescent display apparatus of claim 5, further including one or more display tile controller(s) located on the second or fourth tiles areas of one or more display tiles, the one or more display tile controller(s) being connected to the first or second electrodes of the corresponding display tile(s).

8. The tiled electro-luminescent display apparatus of claim 7, wherein the one or more display tile controller(s) are chiplets having separate substrates independent of the transparent flexible substrate or transparent flexible cover of the display tile(s).

9. The tiled electro-luminescent display apparatus of claim 7, wherein the display tile controller(s) are electrically connected to the display tile controller(s) of a neighboring tile with a communication buss.

10. The tiled electro-luminescent display apparatus of claim 7, wherein the one or more display tile controller(s) are passive-matrix controller(s) and the pixel array is controlled as a passive-matrix pixel array.

11. The tiled electro-luminescent display apparatus of claim 1, further including fifth and sixth neighboring display tiles and wherein:
  a) the first transparent tile area of the third neighboring display tile is disposed above the second tile area of the fifth neighboring display tile so that light emitted from the second edge pixels of the fifth neighboring display tile is transmitted through the first transparent tile area of the third neighboring display tile,
  b) the third transparent tile area of the first neighboring display tile is disposed above the fourth the area of the fifth neighboring display tile so that light emitted from the fourth edge pixels of the fifth neighboring display tile is transmitted through the third transparent tile area of the first neighboring tile;
  c) the first transparent tile area of the sixth neighboring display tile is disposed above the second tile area of the third neighboring display tile so that light emitted from the second edge pixels of the third neighboring display tile is transmitted through the first transparent tile area of the sixth neighboring display tile,
  d) the third transparent tile area of the second neighboring display tile is disposed above the fourth tile area of the sixth neighboring display tile so that light emitted from the fourth edge pixels of the sixth neighboring display tile is transmitted through the third transparent tile area of the second neighboring tile; and
  e) wherein the pixels in the pixel arrays of the display tile and the fifth, sixth, third, and first neighboring display tiles do not overlap, form a regular, two-dimensional pixel array, and are separated by the respective inter-pixel distances in each of the dimensions.

12. The tiled electro-luminescent display apparatus of claim 11, wherein the fifth, third, and sixth neighboring display tiles are offset laterally with respect to the first and second neighboring display tiles.

13. The tiled electro-luminescent display apparatus of claim 1, wherein each display tile has a first flat portion located above the second tile area of the first neighboring display tile, a curved portion in the display area, and a second flat portion in the second tile area, the second flat portion being adjacent to, and in a common plane with, a second flat portion of the second tile area of the first neighboring display tile.

14. The tiled electro-luminescent display apparatus of claim 1, wherein the transparent flexible substrate and transparent flexible cover of one or more display tile(s) have respective edges and wherein the edges are jagged or stepped.

15. The tiled electro-luminescent display apparatus of claim 1, wherein the transparent flexible substrate or transparent flexible cover has a thickness equal to or less than the inter-pixel distance in one or both dimensions.

16. The tiled electro-luminescent display apparatus of claim 1, wherein the pixels have sizes in one or more dimensions and either or both of the transparent flexible substrate or transparent flexible cover has a thickness equal to or less than the pixel width in at least one dimension.

17. The tiled electro-luminescent display apparatus of claim 1, further comprising an emitted-light-diffusing element optically integrated with the one or more layers of light-emitting material.

18. The tiled electro-luminescent display apparatus of claim 1, further comprising an array of color filters located in correspondence with the pixels and a black matrix located between the color filters, and wherein the one or more layers of light-emitting material emit white light to form a full-color tiled display.

* * * * *